(12) United States Patent
Matsushita

(10) Patent No.: US 7,599,817 B2
(45) Date of Patent: Oct. 6, 2009

(54) ABNORMALITY CAUSE SPECIFYING METHOD, ABNORMALITY CAUSE SPECIFYING SYSTEM, AND SEMICONDUCTOR DEVICE FABRICATION METHOD

(75) Inventor: Hiroshi Matsushita, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 477 days.

(21) Appl. No.: 11/452,305

(22) Filed: Jun. 14, 2006

(65) Prior Publication Data

US 2006/0281199 A1 Dec. 14, 2006

(30) Foreign Application Priority Data

Jun. 14, 2005 (JP) ............................... 2005-174137

(51) Int. Cl.
- G06F 11/30 (2006.01)
- G21C 17/00 (2006.01)
- G01B 5/30 (2006.01)

(52) U.S. Cl. ......................................... 702/185; 702/35
(58) Field of Classification Search ......... 702/182–185, 702/34–36, 81, 82, 84; 700/108–110, 121
See application file for complete search history.

(56) References Cited

U.S. PATENT DOCUMENTS

| | | | | |
|---|---|---|---|---|
| 7,031,860 B2 * | 4/2006 | Liang et al. | ................... | 702/84 |
| 7,043,384 B2 | 5/2006 | Matsushita et al. | | |
| 7,197,414 B2 * | 3/2007 | Matsushita et al. | ............ | 702/83 |
| 7,212,952 B2 * | 5/2007 | Watanabe et al. | ........... | 702/183 |
| 2003/0011376 A1 | 1/2003 | Matsushita et al. | | |
| 2004/0049722 A1 | 3/2004 | Matsushita | | |
| 2004/0255198 A1 | 12/2004 | Matsushita et al. | | |
| 2005/0021303 A1 | 1/2005 | Matsushita et al. | | |
| 2005/0194590 A1 | 9/2005 | Matsushita et al. | | |
| 2005/0251365 A1 | 11/2005 | Matsushita et al. | | |

FOREIGN PATENT DOCUMENTS

JP 2004-288743 10/2004

OTHER PUBLICATIONS

English Abstract of 2004-288743, Oct. 14, 2004.*
Matsushita, H. et al., "New Method of Classification System for Wafer Maps," Proceedings of ISSM 2004, 4 Sheets, (2004).
Matsushita, H. et al., "Highly Sensitive Inspection System for Lithography-Related Faults in Agile-Fab-Detecting Algorithm for Monitoring and Evaluation of Yield Impact," IEEE Transactions on Semiconductor Manufacturing, vol. 15, No. 14, pp. 1-7, (Nov. 2002).

* cited by examiner

*Primary Examiner*—Michael P Nghiem
(74) *Attorney, Agent, or Firm*—Finnegan, Henderson, Farabow, Garrett & Dunner, L.L.P.

(57) ABSTRACT

A feature amount is generated by standardizing inspection data related to a fabrication unit for each type, a similar set including fabrication units corresponding to similar feature amounts is formed by comparing the feature amounts, and apparatus difference analysis is performed between a plurality of fabrication units forming the similar set. A two-level orthogonal table is used to determine whether to adopt a feature amount of each type, and some feature amounts are not used in the apparatus difference analysis and the like by optimizing the smaller-the-better characteristic or the larger-the-better characteristic of a test value of the apparatus difference analysis, thereby reducing the calculation amount and accurately and efficiently specifying an abnormality cause.

18 Claims, 14 Drawing Sheets

Wafer test data
Lot #1672
| Waveform number | Generalized feature amount | Remarks |
|---|---|---|
| 1 | 0.467 | Region 1 |
| 2 | 0.762 | Region 2 |
| ⋮ | ⋮ | ⋮ |
F I G. 9
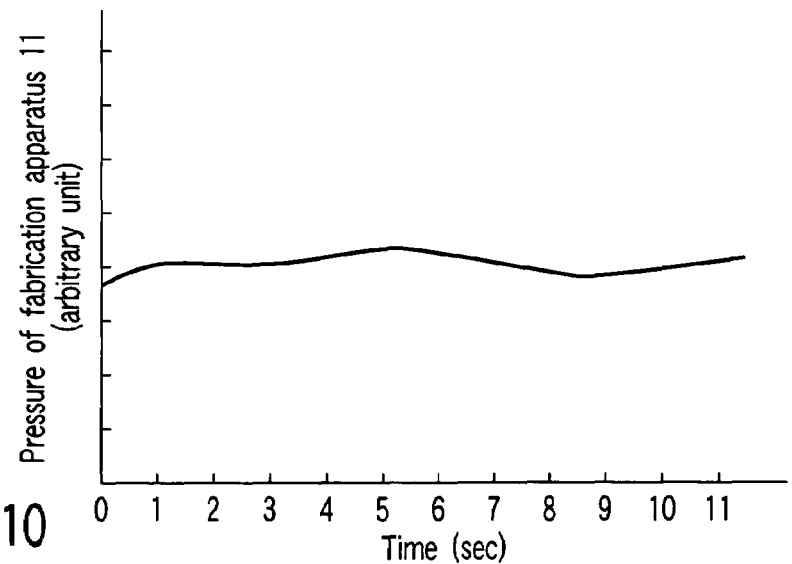
F I G. 10
EES data (pressure of apparatus 11)
Lot #1672
| Waveform number | Generalized feature amount | Remarks |
|---|---|---|
| 1 | 1.613 | Time=0s |
| 2 | 1.614 | Time=1s |
| ⋮ | ⋮ | ⋮ |
F I G. 11

Factor number

| Trial number | 1 | 2 | 3 | 4 | 5 | 6 | 7 | 8 | 9 | 10 | 11 |
|---|---|---|---|---|---|---|---|---|---|---|---|
| 1 | 1 | 1 | 1 | 1 | 1 | 1 | 1 | 1 | 1 | 1 | 1 |
| 2 | 1 | 1 | 1 | 1 | 1 | 2 | 2 | 2 | 2 | 2 | 2 |
| 3 | 1 | 1 | 2 | 2 | 2 | 1 | 1 | 1 | 2 | 2 | 2 |
| 4 | 1 | 2 | 1 | 2 | 2 | 1 | 2 | 2 | 1 | 1 | 2 |
| 5 | 1 | 2 | 2 | 1 | 2 | 2 | 1 | 2 | 1 | 2 | 1 |
| 6 | 1 | 2 | 2 | 2 | 1 | 2 | 2 | 1 | 2 | 1 | 1 |
| 7 | 2 | 1 | 2 | 2 | 1 | 1 | 2 | 2 | 1 | 2 | 1 |
| 8 | 2 | 1 | 2 | 1 | 2 | 2 | 2 | 1 | 1 | 1 | 2 |
| 9 | 2 | 1 | 1 | 2 | 2 | 2 | 1 | 2 | 2 | 1 | 1 |
| 10 | 2 | 2 | 2 | 1 | 1 | 1 | 1 | 2 | 2 | 1 | 2 |
| 11 | 2 | 2 | 1 | 2 | 1 | 2 | 1 | 1 | 1 | 2 | 2 |
| 12 | 2 | 2 | 1 | 1 | 2 | 1 | 2 | 1 | 2 | 2 | 1 |

F I G. 13

| Factor number | Waveform data name |
|---|---|
| 1 | Wafer test data |
| 2 | Step A defect data |
| ⋮ | ⋮ |
| 10 | Transistor threshold voltage |
| 11 | None |

F I G. 14

| Trial number | Similar lot set : Snm (abnormality degree Pnm) | | | | | Minimum abnormality degree Pn |
|---|---|---|---|---|---|---|
| No.1 | S11 (P11) | S12 (P12) | S13 (P13) | | | P1 : 0.12 |
| No.2 | S21 (P21) | S22 (P22) | | | | P2 : 0.02 |
| No.3 | S31 (P31) | S32 (P32) | S33 (P33) | S34 (P34) | | P3 : 0.01 |
| | | | | | | |
| No.n | | | | | | Pn |
| | | | | | | |
| No.12 | S121 (P121) | S122 (P122) | S123 (P123) | | | P12 : 0.26 |

F I G. 15

US 7,599,817 B2

ABNORMALITY CAUSE SPECIFYING METHOD, ABNORMALITY CAUSE SPECIFYING SYSTEM, AND SEMICONDUCTOR DEVICE FABRICATION METHOD

CROSS-REFERENCE TO RELATED APPLICATIONS

This application is based upon and claims the benefit of priority from prior Japanese Patent Application No. 2005-174137, filed Jun. 14, 2005, the entire contents of which are incorporated herein by reference.

BACKGROUND OF THE INVENTION

1. Field of the Invention

The present invention relates to a method and system of specifying an abnormality cause in the fabrication process of a product, and a semiconductor device fabrication method.

2. Description of the Related Art

One of the largest problems to be solved to increase the productivity of products, e.g., semiconductor devices is to increase the yield. To increase the yield, it is important to analyze the yield loss, and find and improve the process, fabrication apparatus, or design condition which is used in the fabrication process having caused the loss, in the early stages. However, semiconductor devices, particularly, semiconductor integrated circuits (LSIs) are produced through hundreds of fabrication steps and fabrication apparatuses. Once a defective LSI is produced, therefore, it is generally very difficult to specify the abnormality cause of the defective product.

The results of a wafer test which is a semiconductor device electrical characteristic test conducted after the wafer process is completed sometimes gives an important clue to find an abnormality cause. This is so because the wafer process and wafer test are performed with a plurality of semiconductor devices being kept arranged on a round wafer. A position where a defective semiconductor device is produced on the wafer surface is specified by indicating the results of the wafer test as positions in the plane of the wafer by mapping. A representative mapping indication is a fail bit map (FBM) obtained for memory products. Also, a pass/fail map which indicates each good product (pass) and each bad product (fail) by mapping is used for logic products or memory embedded logic products.

In these fail bit map and pass/fail map, defect distributions in the plane of a wafer are roughly classified into a random defect distribution in which defects evenly distribute regardless of positions on the wafer surface, and a clustering defect distribution in which positions on the wafer surface are biased. Of these distributions, the clustering defect distribution is in many cases caused by the process, fabrication apparatus, or the like as an abnormality cause. This clustering defect distribution is regarded as a "fingerprint" of an abnormality cause resulting from the process or fabrication apparatus. That is, if an abnormality occurs in a certain process or fabrication apparatus, defective products having a clustering defect distribution unique to the process or fabrication apparatus are produced.

From the foregoing, an abnormality cause in the fabrication of semiconductor devices can be specified by specifying a fabrication apparatus used in certain steps of the fabrication process in common, for a plurality of wafers in which the same clustering defect distribution occurs, or for a plurality of lots formed by these wafers (e.g., Jpn. Pat. Appln. KOKAI Publication No. 2004-288743).

Unfortunately, there are hundreds of semiconductor device fabrication steps. To make it possible to specify an abnormality cause in each individual fabrication step, therefore, it is necessary to acquire various data in these fabrication steps and in inspection steps before and after the fabrication steps, and this makes the data amount enormous. The enormous data makes it very difficult to select data which is truly significant to specify an abnormality cause, thereby making specification of an abnormality cause impossible.

BRIEF SUMMARY OF THE INVENTION

An abnormality cause specifying method of the present invention according to the first aspect comprises acquiring, for each fabrication unit, a plurality of types of inspection data in a plurality of fabrication steps of a product fabrication process; generating a feature amount by standardizing the inspection data for each type; generating, for each fabrication unit, a trial data set by selecting the feature amount corresponding to the inspection data of the type on an adoption level for each trial experiment in a two-level orthogonal table, by using two levels of the two-level orthogonal table as the adoption level and a non-adoption level of the type, and using a factor of the two-level orthogonal table as the type; calculating, for the trial data set, a trial similarity representing a degree of similarity between the fabrication units; generating, for each fabrication unit, a trial set by extracting another fabrication unit whose trial similarity is equal to or larger than a threshold value; calculating, for each trial experiment and for each fabrication step, a step test value representing a degree of a causal relation of the fabrication unit forming the trial set to a difference between a plurality of fabrication apparatuses used in the fabrication step; setting, for each trial experiment, the step test value whose degree of the nominal-the-best characteristic is largest of the trial set as a trial experiment test value; generating, for each fabrication unit, an optimum data set including the feature amount corresponding to the type for which the adoption level is selected, on the basis of a factorial effect diagram for optimizing the nominal-the-best characteristic of the trial experiment test value by using the adoption level and the non-adoption level of each type; calculating, for the optimum data set, an optimum similarity representing a degree of similarity between the fabrication units; generating, for each fabrication unit, an optimum set by extracting another fabrication unit whose optimum similarity is equal to or larger than a threshold value; calculating, for each fabrication step, an optimum test value representing a degree of a causal relation of the fabrication unit forming the optimum set to a difference between a plurality of fabrication apparatuses used in the fabrication step; determining, for each optimum set, whether the causal relation of the optimum set to the difference between the fabrication apparatuses is significant, on the basis of the optimum test value; and extracting, for each optimum set, the fabrication apparatus as an object of the causal relation found to be significant, as an abnormality cause.

An abnormality cause specifying system of the present invention according to the second aspect comprises a data acquisition unit which acquires, for each fabrication unit, a plurality of types of inspection data in a plurality of fabrication steps of a product fabrication process; a feature amount generator which generates a feature amount by standardizing the inspection data for each type; a trial data set generator which generates, for each fabrication unit, a trial data set by selecting the feature amount corresponding to the inspection data of the type on an adoption level for each trial experiment in a two-level orthogonal table, by using two levels of the two-level orthogonal table as the adoption level and a non-adoption level of the type, and using a factor of the two-level orthogonal table as the type; a trial similarity calculator which calculates, for the trial data set, a trial similarity representing a degree of similarity between the fabrication units; a trial set generator which generates, for each fabrication unit, a trial set by extracting another fabrication unit whose trial similarity is equal to or larger than a threshold value; a step test value calculator which calculates, for each trial experiment and for each fabrication step, a step test value representing a degree of a causal relation of the fabrication unit forming the trial set to a difference between a plurality of fabrication apparatuses used in the fabrication step; a maximum test value setting unit which sets, for each trial experiment, the step test value whose degree of the nominal-the-best characteristic is largest of the trial set as a maximum test value; an optimum data set generator which generates, for each fabrication unit, an optimum data set including the feature amount corresponding to the type for which the adoption level is selected, on the basis of a factorial effect diagram for optimizing the nominal-the-best characteristic of the maximum test value by using the adoption level and the non-adoption level of each type; an optimum similarity calculator which calculates, for the optimum data set, an optimum similarity representing a degree of similarity between the fabrication units; an optimum set generator which generates, for each fabrication unit, an optimum set by extracting another fabrication unit whose optimum similarity is equal to or larger than a threshold value; an optimum test value calculator which calculates, for each fabrication step, an optimum test value representing a degree of a causal relation of the fabrication unit forming the optimum set to a difference between a plurality of fabrication apparatuses used in the fabrication step; a determination unit which determines, for each optimum set, whether the causal relation of the optimum set to the difference between the fabrication apparatuses is significant, on the basis of the optimum test value; and an extractor which extracts, for each optimum set, the fabrication apparatus as an object of the causal relation found to be significant, as an abnormality cause.

A semiconductor device fabrication method of the present invention according to the third aspect comprises fabricating a semiconductor device as a product; performing an abnormality cause specifying method for the semiconductor device, the abnormality cause specifying method comprising acquiring, for each fabrication unit, a plurality of types of inspection data in a plurality of fabrication steps of a product fabrication process, generating a feature amount by standardizing the inspection data for each type, generating, for each fabrication unit, a trial data set by selecting the feature amount corresponding to the inspection data of the type on an adoption level for each trial experiment in a two-level orthogonal table, by using two levels of the two-level orthogonal table as the adoption level and a non-adoption level of the type, and using a factor of the two-level orthogonal table as the type, calculating, for the trial data set, a trial similarity representing a degree of similarity between the fabrication units, generating, for each fabrication unit, a trial set by extracting another fabrication unit whose trial similarity is equal to or larger than a threshold value, calculating, for each trial experiment and for each fabrication step, a step test value representing a degree of a causal relation of the fabrication unit forming the trial set to a difference between a plurality of fabrication apparatuses used in the fabrication step, setting, for each trial experiment, the step test value whose degree of the nominal-the-best characteristic is largest of the trial set as a trial experiment test value, generating, for each fabrication unit, an optimum data set including the feature amount corresponding to the type for which the adoption level is selected, on the basis of a factorial effect diagram for optimizing the nominal-the-best characteristic of the trial experiment test value by using the adoption level and the non-adoption level of each type, calculating, for the optimum data set, an optimum similarity representing a degree of similarity between the fabrication units, generating, for each fabrication unit, an optimum set by extracting another fabrication unit whose optimum similarity is equal to or larger than a threshold value, calculating, for each fabrication step, an optimum test value representing a degree of a causal relation of the fabrication unit forming the optimum set to a difference between a plurality of fabrication apparatuses used in the fabrication step, determining, for each optimum set, whether the causal relation of the optimum set to the difference between the fabrication apparatuses is significant, on the basis of the optimum test value, and extracting, for each optimum set, the fabrication apparatus as an object of the causal relation found to be significant, as an abnormality cause; extracting, for each optimum set, the inspection data related to the fabrication step in which the fabrication apparatus as the abnormality cause is used, as abnormality data; and adjusting the fabrication apparatus extracted as the abnormality cause such that the abnormality data is corrected.

BRIEF DESCRIPTION OF THE SEVERAL VIEWS OF THE DRAWING

FIG. 9 is a table of generalized feature amounts generated from wafer test data;

FIG. 10 is a graph for explaining generalized feature amounts, which represents the dependence of the pressure of a fabrication apparatus on time;

FIG. 11 is a table of generalized feature amounts generated from the pressure data of the fabrication apparatus;

FIG. 13 is a two-level orthogonal table;

FIG. 14 is a table in which the types of waveform data of generalized feature amounts are allocated to factors;

FIG. 15 is a table showing a list of similar lot sets corresponding to individual numbers in trial experiments;

DETAILED DESCRIPTION OF THE INVENTION

Figure 1:
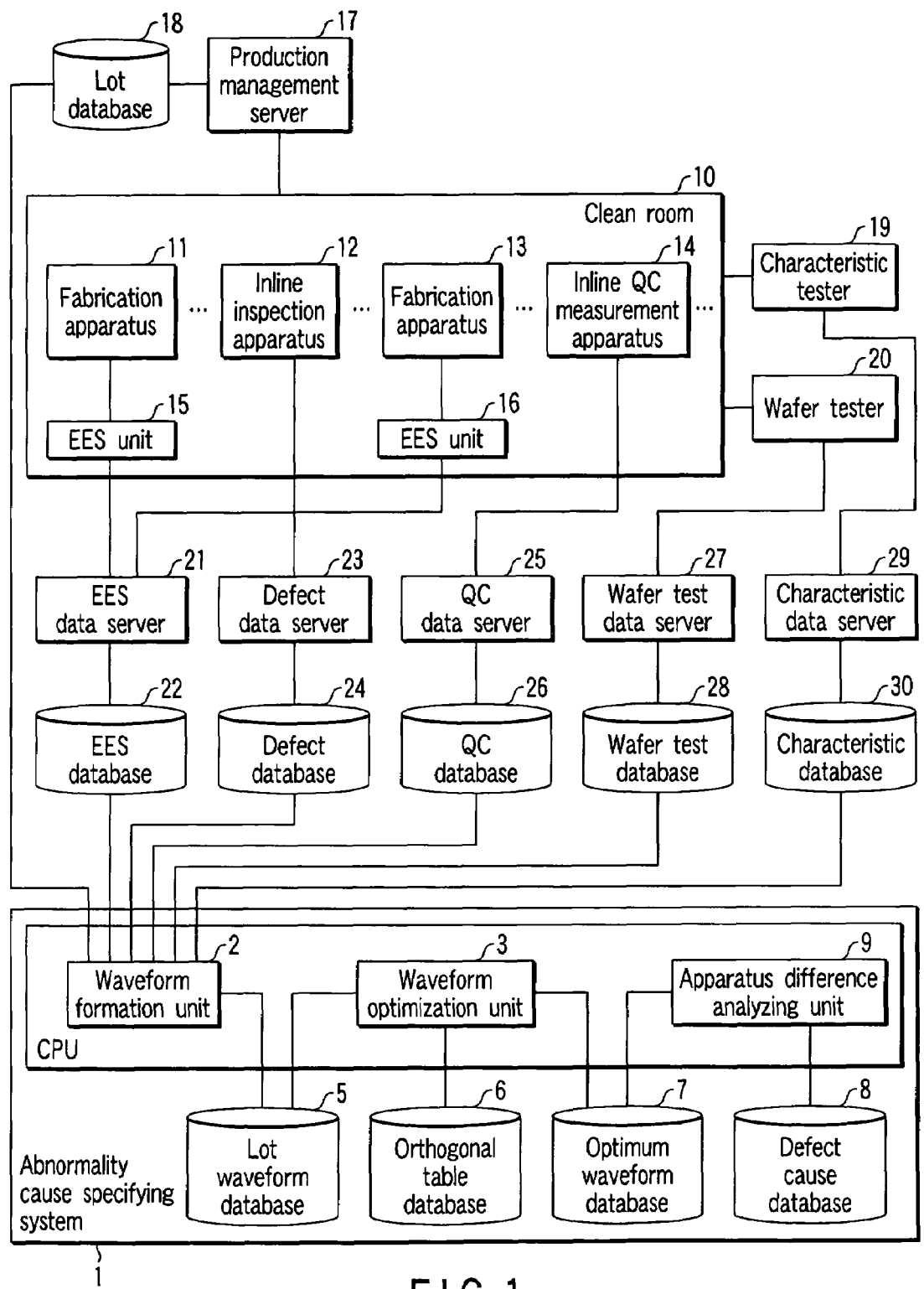
FIG. 1 is a view showing the configuration of a semiconductor device fabrication system having an abnormality cause specifying system according to an embodiment of the present invention.

Embodiments of the present invention will be described below with reference to the accompanying drawing. Note that the embodiments of the present invention will be explained below with reference to the accompanying drawing, but the drawing is used for the purpose of explanation alone, and the present invention is not limited to the drawing. In the following description of the drawing, the same or similar reference numerals denote the same or similar parts. Note also that each figure is a schematic view, so the relationships between the thickness and the planar dimensions, the ratio of the thicknesses of layers, and the like are different from actual ones.

First Embodiment (Semiconductor Device Fabrication System)

As shown in FIG. 1, a semiconductor device fabrication system has a clean room 10 which includes fabrication apparatuses 11 and 13, an inline inspection apparatus 12, an inline quality control (QC) measurement apparatus 14, and equipment engineering systems (EESs) 15 and 16 connected to the fabrication apparatuses 11 and 13, respectively.

To fabricate semiconductor devices, the fabrication apparatuses 11 and 13 perform processing of semiconductor wafers forming lots under various operating conditions, and the states of semiconductor devices momentarily change in accordance with the processing. The device state can be represented by any of various physical amounts such as the internal pressure, gas flow rate, and temperature of a chamber, and the exposure amount of an exposure apparatus. Data of these physical amounts at each time is called EES data. The EES data can be obtained by attaching the EES units 15 and 16 for monitoring the device states to the fabrication apparatuses 11 and 13, respectively. In the semiconductor device fabrication system, the EES data obtained by the EES units 15 and 16 is supplied to an EES data server 21 and stored in an EES database 22.

Inspection steps are added before and after each principal fabrication step, and the inline inspection apparatus 12 inspects foreign matter and abnormalities of circuit patterns on semiconductor wafers in the middle of fabrication. Defect data as a result of this inspection is stored in a defect database 24 via a defect data server 23. Likewise, measurement steps are added before and after each principal fabrication step, and the inline QC measurement apparatus 14 measures the film thickness of a thin film added during the processing in the fabrication step, the dimensions of a shape processed in the fabrication step, and the like. These film thickness, dimensions, and the like are called QC data. The QC data is stored in a QC database 26 via a QC data server 25.

In addition to a semiconductor device as a product, a test element group (TEG) for evaluating electrical characteristics is fabricated as an exclusive lot or wafer, or as a part of a product circuit pattern of a semiconductor device. After the wafer process is completed, a characteristic tester 19 measures the electrical characteristics of this TEG in the form of a wafer. The measurement results are stored in a characteristic database 30 via a characteristic data server 29. Furthermore, a wafer tester 20 tests each semiconductor device having undergone the wafer process to check whether the device performs an intended operation. This test is called a wafer test because it is conducted with semiconductor devices being kept arranged on a wafer. If an operation defect is found, a wafer test data server 27 acquires, as wafer test data, the type of the defect and the position of that chip in the plane of the wafer, which corresponds to a semiconductor device having the operation defect. The wafer test data is stored in a wafer test database 28 via the wafer test data server 27.

A production management server 17 adds lot numbers to all lots flowing in the clean room 10. The production management server 17 manages, for each lot, a fabrication flow which defines the processing order of fabrication steps, inspection steps, and measurement steps, a fabrication schedule, and the fabrication conditions of each fabrication step, and stores these data in a lot database 18.

The identification number and processing date/time of each of the fabrication apparatuses 11 and 13 having processed each lot (i.e., the fabrication apparatus log of each lot), and the EES data, defect data, QC data, characteristic data, and wafer test data of the lot are stored in the databases 22, 24, 26, 28, and 30 in relation to the lot number. In the semiconductor device fabrication system as described above, the EES data, defect data, QC data, characteristic data, and wafer test data are acquired and managed for each lot together with the fabrication apparatus log.

(Abnormality Cause Specifying System 1)

The semiconductor device fabrication system has an abnormality cause specifying system 1. The abnormality cause specifying system 1 has a central processing unit CPU. That is, the abnormality cause specifying system 1 can be a computer or can also be implemented by allowing a computer to execute a procedure written in a program. The abnormality cause specifying system 1 also has a lot waveform database 5, orthogonal table database 6, optimum waveform database 7, and defect cause database 8. The CPU has a waveform formation unit 2, waveform optimization unit 3, and apparatus difference analyzing unit 9.

Figure 2:
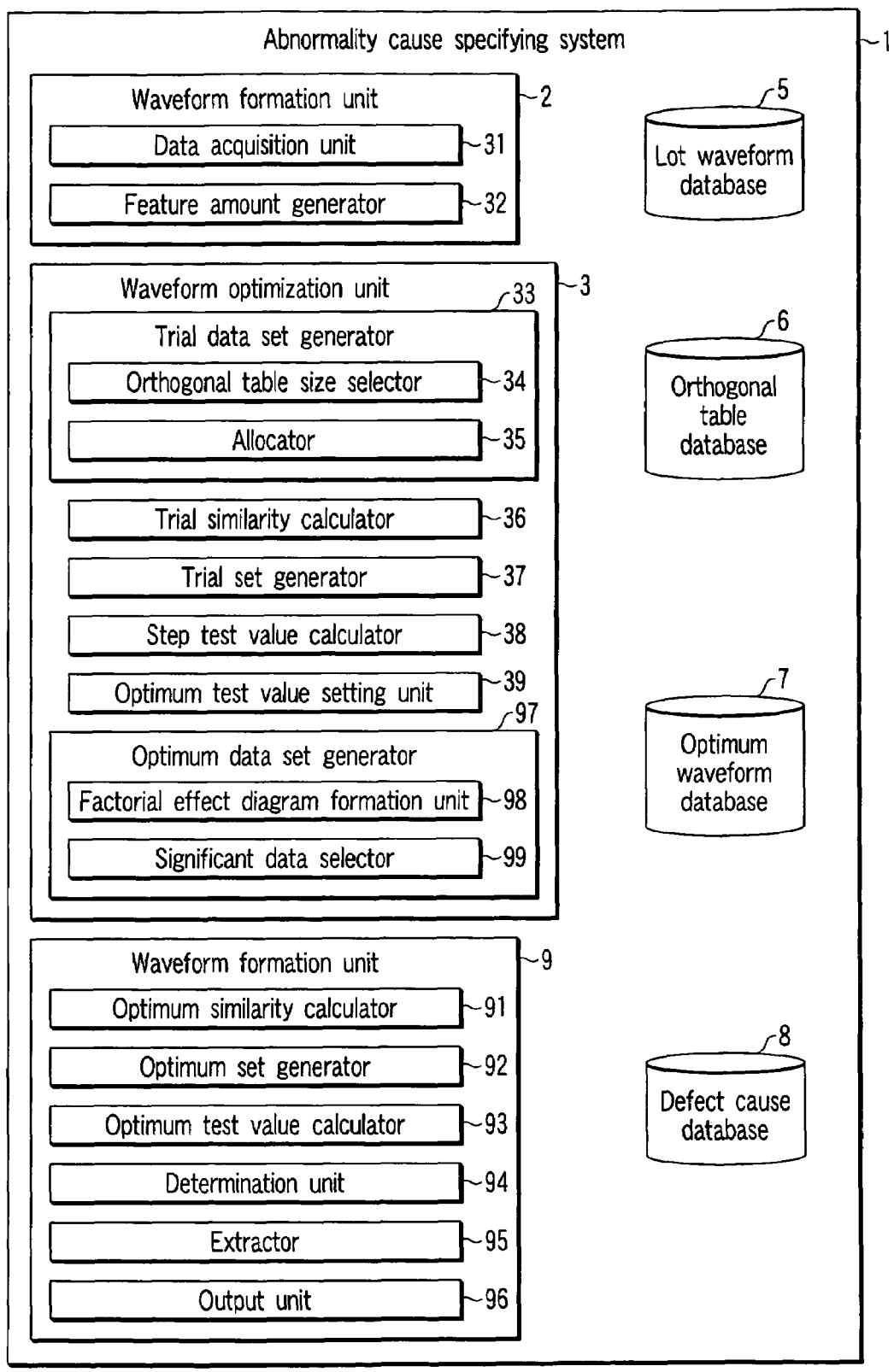
FIG. 2 is a view showing the abnormality cause specifying system according to the embodiment of the present invention.

As shown in FIG. 2, the waveform formation unit 2 has a data acquisition unit 31 and feature amount generator 32.

The waveform optimization unit 3 has a trial data set generator 33, trial similarity calculator 36, trial set generator 37, step test value calculator 38, optimum test value setting unit 39, and optimum data set generator 97. The trial data set generator 33 has an orthogonal table size selector 34 and allocator 35. The optimum data set generator 97 has a factorial effect diagram formation unit 98 and significant data selector 99.

The apparatus difference analyzing unit 9 has an optimum similarity calculator 91, optimum set generator 92, optimum test value calculator 93, determination unit 94, extractor 95, and output unit 96.

(Semiconductor Device Fabrication Method)

Figure 3:
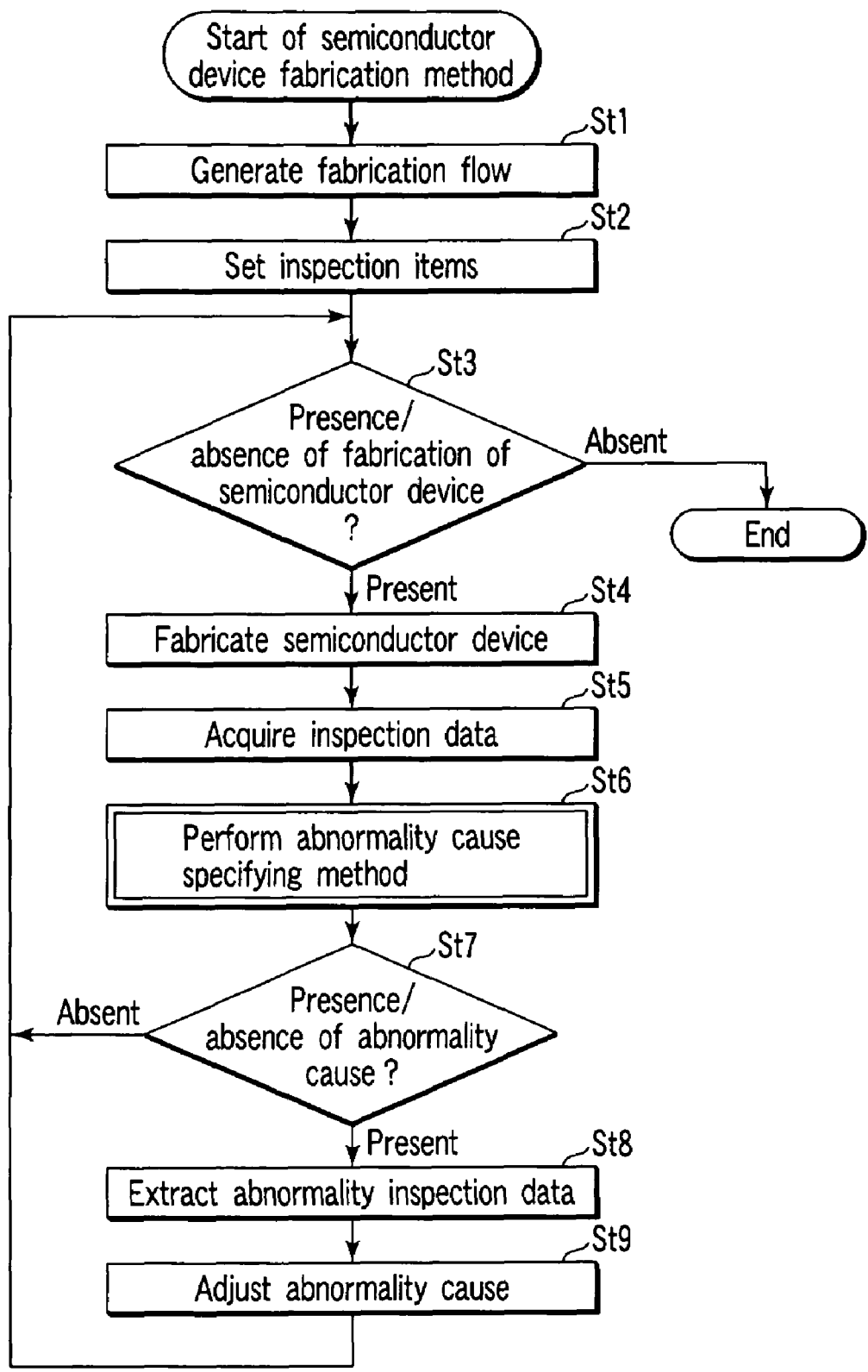
FIG. 3 is a flowchart of a semiconductor device fabrication method including an abnormality cause specifying method according to the embodiment of the present invention.

As shown in FIG. 3, in step St1 of a semiconductor device fabrication method, the production management server 17 generates a fabrication flow and stores it in the lot database 18 for each lot as a semiconductor device fabrication unit. In this fabrication flow, the order of a plurality of fabrication steps for fabricating semiconductor devices and the fabrication conditions of each fabrication step are set.

In step St2, the production management server 17 sets inspection items and stores them in the lot database 18 for each lot. As the inspection items, fabrication steps of the fabrication flow before and after inspection steps, measurement steps, and test steps are performed, the inspection conditions of the inspection steps, measurement steps, and test steps, and the like are set.

In step St3, the production management server 17 checks the presence/absence of a fabrication start designation for each lot of semiconductor devices. If there is no fabrication start designation, the semiconductor device fabrication method is terminated. If there is a fabrication start designation, the flow advances to step St4.

In step St4, semiconductor devices of each lot are fabricated in accordance with the fabrication flow by using the fabrication apparatuses 11 and 13 in the clean room 10.

In step St5, EES data, defect data, QC data, characteristic data, and wafer test data of each lot are acquired in accordance with the fabrication flow by using the inline inspection apparatus 12, inline QC measurement apparatus 14, and EES units 15 and 16 inside the clean room 10 and the characteristic tester 19 and wafer tester 20 outside the clean room 10. The EES data, QC data, characteristic data, and wafer test data are stored in the databases 22, 24, 26, 28, and 30 via the servers 21, 23, 25, 27, and 29.

In step St6, the abnormality cause specifying system 1 performs an abnormality cause specifying method by using the EES data, QC data, characteristic data, and wafer test data, and outputs the identification code of a fabrication apparatus as an abnormality cause and the identification code of a fabrication step using this fabrication apparatus.

In step St7, the abnormality cause specifying system 1 checks the presence/absence of an abnormality cause on the basis of the presence/absence of the identification code of a fabrication apparatus as an abnormality cause and that of a fabrication step using the apparatus. If there is no abnormality cause, the flow returns to step St3. If there is an abnormality cause, the flow advances to step St8.

In step St8, the abnormality cause specifying system 1 extracts, for each set of lots processed by a fabrication apparatus as the abnormality cause, EES data, QC data, characteristic data, and wafer test data related to a fabrication step using the fabrication apparatus as the abnormality cause, as abnormality data.

In step St9, the operator or someone else adjusts the fabrication apparatus 11 or 13 as the abnormality cause so as to correct the abnormality data. After the adjustment, the flow returns to step St3.

(Abnormality Cause Specifying Method)

Figure 4:
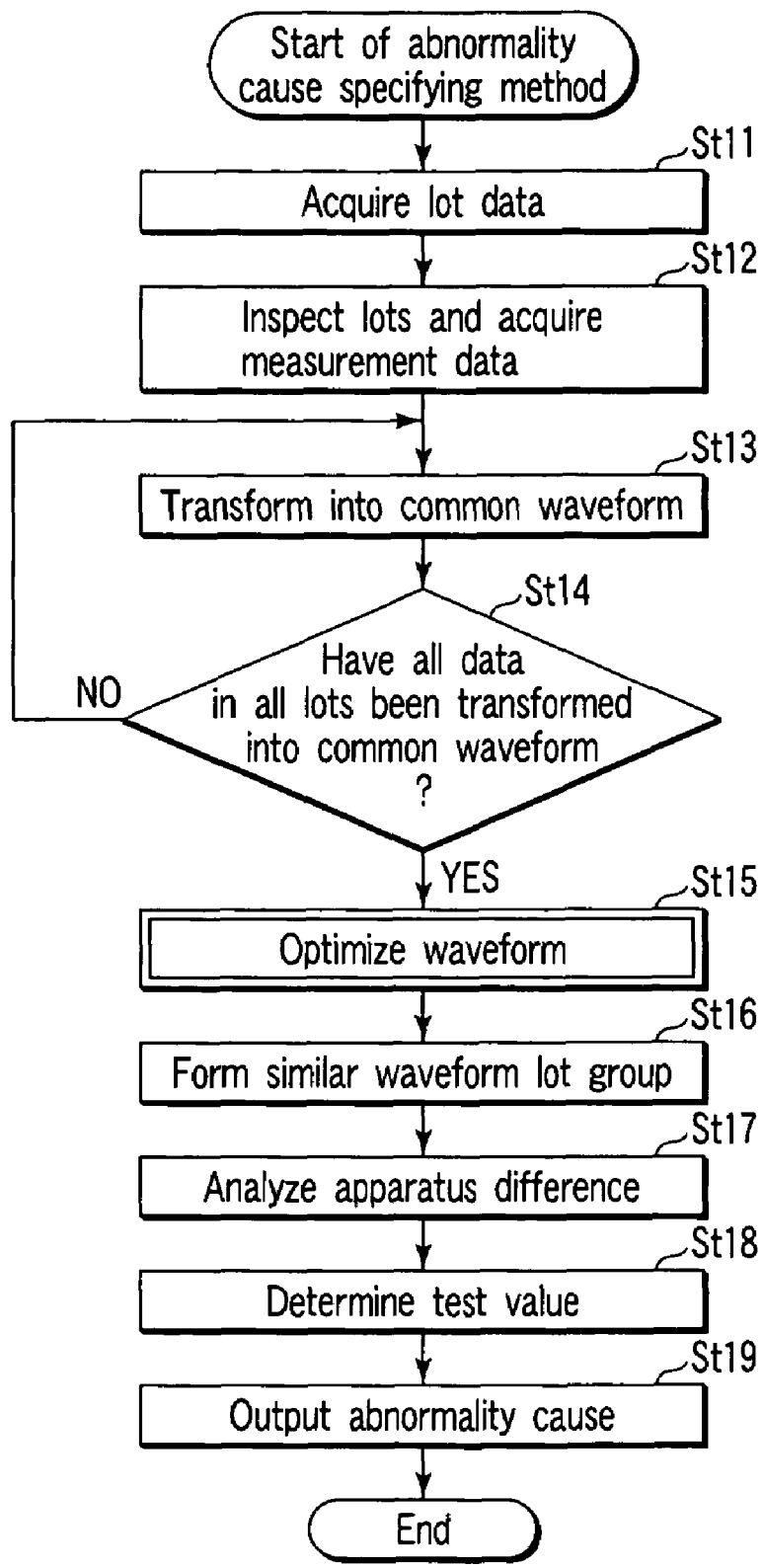
FIG. 4 is a flowchart of the abnormality cause specifying method according to the embodiment of the present invention.

As shown in FIG. 4, in step St11 of an abnormality cause specifying method, the data acquisition unit 31 acquires the identification number of a lot as a fabrication unit from the lot database 18.

In step St12, the data acquisition unit 31 acquires, for each lot corresponding to the acquired identification number, a plurality of types of inspection data, i.e., EES data, defect data, QC data, characteristic data, and wafer test data in a plurality of fabrication steps of the fabrication process of products from the databases 22, 24, 26, 28, and 30.

In step St13, the feature amount generator 32 generates a feature amount by standardizing inspection data of each type, thereby forming a common waveform of the inspection data of each type.

An abnormality in the fabrication of semiconductor devices appears in various forms in EES data, defect data, QC data, characteristic data, and wafer test data. In the wafer test data, for example, an abnormality appears as an increase in the number of defective chips in the lot and a decrease in yield. Also, in defect data and QC data obtained by inspection in the middle of a fabrication step, an abnormality sometimes appears as an increase in foreign matter or as a deviation from the specifying range of a processed shape. To specify these abnormality causes in the early stages, the acquired EES data, defect data, QC data, characteristic data, and wafer test data are analyzed in the following steps. Although apparatus difference analysis is used as this analysis, the EES data, defect data, QC data, characteristic data, and wafer test data are acquired in their respective unique forms, and the analysis cannot be performed by combining different types of data. Therefore, each data is expressed by numerical values indicating feature amounts having a common form for each lot. The algorithm of transform to this common form is defined for each data.

Figure 7:
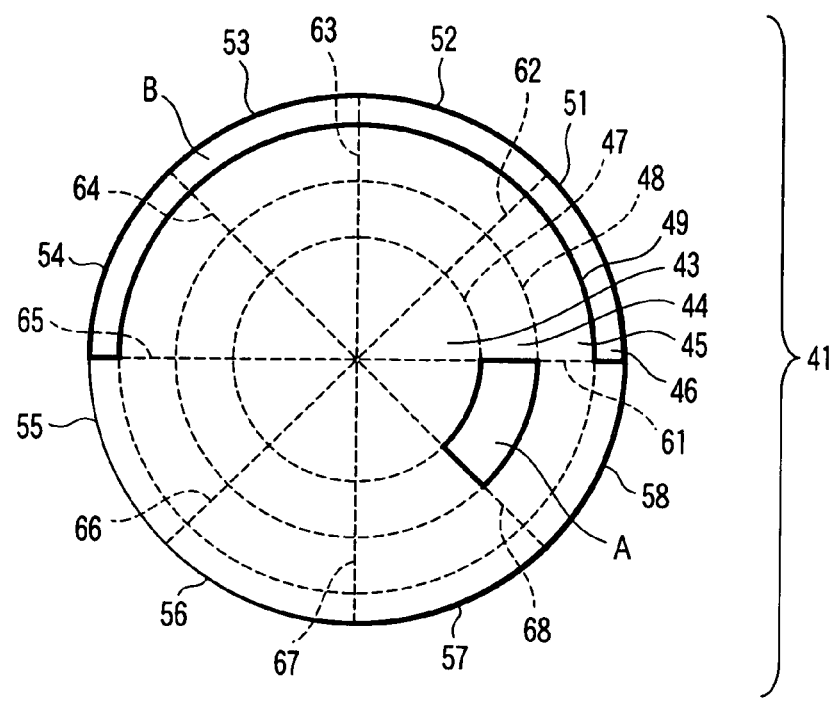
FIG. 7 is a diagram showing region segments on a wafer forming a semiconductor device lot.
Figure 8:
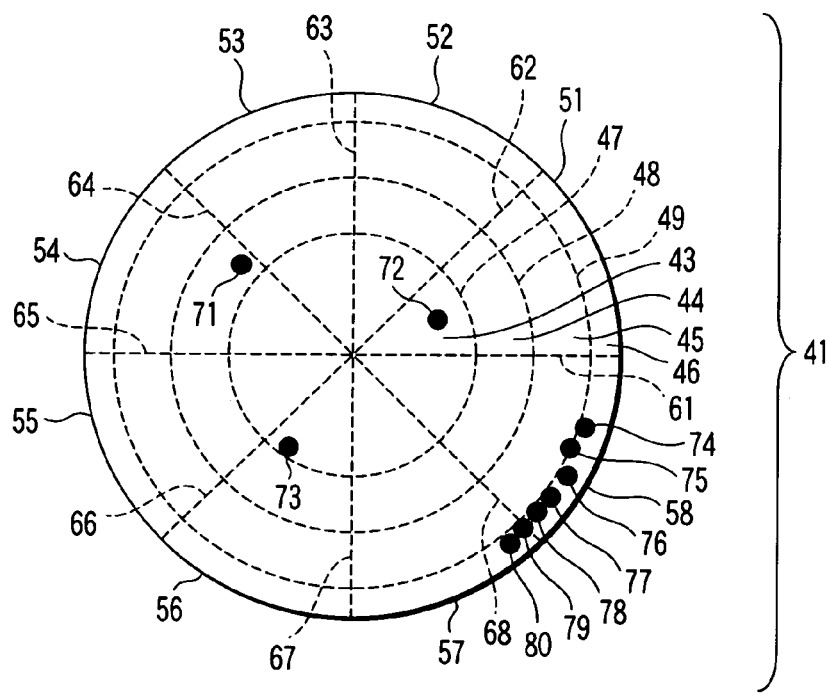
FIG. 8 is a fail bit map for explaining generalized feature amounts, which is formed on the region segments.

For the wafer test data, for example, regions on the wafer surface as shown in FIGS. 7 and 8 are defined, the existence ratio in each region is calculated, and a value calculated by integrating and averaging the existence ratios for each lot is used as a feature amount. To quantitatively represent the similarly which indicates whether a defective product clustering distribution shown in FIG. 8 is similar, a defect clustering distribution is represented by a feature amount as a large number of numerical values.

First, a wafer is divided into a plurality of region segments. As shown in FIG. 7, letting r be the radius of the wafer, a boundary line 47 is formed at a distance of ½r in the radial direction from the wafer center, a boundary line 48 is formed at a distance of ¾r in the radial direction, and a boundary line 49 is formed to separate chips so arranged on the outermost periphery of the wafer as to be in contact with the wafer edge from other chips arranged inside the wafer. A wafer indicating region 41 is divided into four ring-like regions 43 to 46 by the three boundary lines 47 to 49.

Then, eight boundary lines 61 to 68 which divide the wafer at every 45° in the angular direction of the central angle are formed. The wafer indicating region 41 is divided into eight fan-shaped regions 51 to 58 by the eight boundary lines 61 to 68.

A total of 104 region segments are defined by combining the regions 43 to 46 in the radial direction and the regions 51 to 58 in the angular direction. For example, a region segment A is defined as the logical product of the region segment 44 from ½r to ¾r in the radial direction and the region segment 58 from 315° to 360° in the angular direction. A region segment B is defined as the logical product of the wafer edge region segment 46 in the radial direction and the region segments 51 to 54 from 0° to 180° in the angular direction. Any other region segment can be similarly defined as the logical product of region segments in the radial direction and angular direction.

Subsequently, as shown in FIG. 8, defect indicating regions 71 to 80 of defective bits are compared with the positions of region segments, and an existence ratio $f_i$ of a defective bit in each region segment i of the 104 region segments is calculated. Letting $nr_i$ be the total number of bits in the region segment i and $nf_i$ be the total number of defective bits in the region segment i, the defective bit existence ratio $f_i$ is calculated by $$f_i = nf_i/nr_i \tag{1}$$

where i is a number allocated to each region segment.

For example, the defective bit 71 is positioned in region segment 1 as the logical product of the region segments 44 and 54. When the total number of bits in region segment 1 is 10, a defective bit existence ratio $f_1$ is 1/10, i.e., 0.1. The defective bit 72 is positioned in region segment 2 as the logical product of the region segments 43 and 51. When the total number of bits in region segment 2 is 10, a defective bit existence ratio $f_2$ is 1/10, i.e., 0.1. The defective bit 73 is positioned in region segment 3 as the logical product of the region segments 43 and 56. When the total number of bits in region segment 3 is 10, a defective bit existence ratio $f_3$ is 1/10, i.e., 0.1. The defective bits 74 to 78 are positioned in region segment 4 as the logical product of the region segments 46 and 58. When the total number of bits in region segment 4 is 10, a defective bit existence ratio $f_4$ is 5/10, i.e., 0.5. The defective bits 79 and 80 are positioned in region segment 5 as the logical product of the region segments 46 and 57. When the total number of bits in region segment 5 is 10, a defective bit existence ratio $f_5$ is 2/10, i.e., 0.2. The defective bits 74 to 80 are positioned in region segment 6 as the logical product of the region segments 46, 57, and 58. When the total number of bits in region segment 6 is 20, a defective bit existence ratio $f_6$ is 7/20, i.e., 0.35. The defective bits 74 to 78 are positioned in region segment 7 as the logical product of the region segments 46 and 58. When the total number of bits in region segment 7 is 20, a defective bit existence ratio $f_7$ is 5/20, i.e., 0.25.

The feature amount of each lot is calculated by using the defective bit existence ratios $f_i$. This feature amount is calculated by integrating and averaging the existence ratios $f_i$ for each lot. More specifically, as shown in FIG. 9, for the wafer test data of lot #1672, a feature amount is 0.467 in region segment 1, and waveform number 1 is allocated to this feature amount of 0.467. Also, a feature amount is 0.762 in region segment 2, and waveform number 2 is allocated to this feature amount of 0.762. Similarly, feature amounts in region segments 3 to 104 are calculated, and waveform numbers 3 to 104 are allocated to the calculated feature amounts.

Wafer tests for finding defective bits are performed on various types of electrical characteristics. Examples are a function test for checking whether each bit operates as a memory, and a margin test for checking whether the operation time and current value of each bit satisfy the product standards even when the bit operates as a memory. The defect existence ratio f in each region segment is calculated by equation (1) for each wafer test and for each wafer of each lot. The feature amount is calculated by integrating and averaging the existence ratios f in individual region segments for each lot, and waveform numbers are allocated to the calculated feature amounts.

For the defect data, characteristic data, and QC data, the average value per lot of the measurement values in each region segment shown in FIG. 7 is used as the feature amount. Waveform numbers are allocated to these feature amounts.

For the EES data, a time series change in state of the fabrication apparatus 11 or 13 during a period in which each lot is processed is used. More specifically, when the chamber internal pressure of the fabrication apparatus 11 is acquired as the EES data at an interval of 1 sec for lot #1672 as shown in FIG. 10, the chamber internal pressure at each time is calculated as the feature amount at an interval of 1 sec. Waveform numbers are allocated to these feature amounts.

Figure 12:
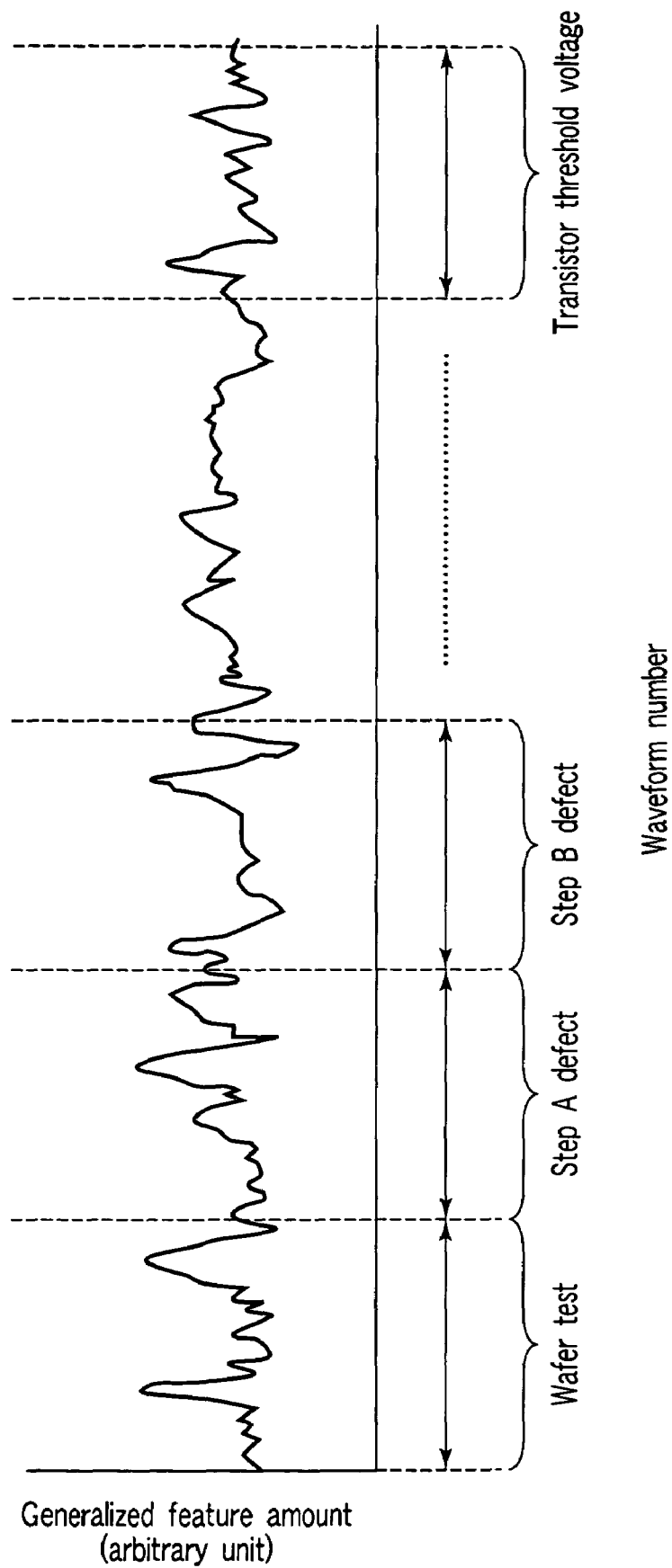
FIG. 12 is a timing chart of generalized feature amounts.

When these feature amounts having the series of waveform numbers are expressed as a line graph indicating the feature amount as a function of the waveform number, waveform data is obtained for each of wafer test data, fabrication step A defect data, fabrication step B defect data, . . . , transistor threshold voltage data as shown in FIG. 12. These waveform data will be called wafer test waveform data, fabrication step A defect waveform data, fabrication step B defect waveform data, . . . , transistor threshold voltage waveform data. These waveform data are stored in the lot waveform database 5 in one-to-one correspondence with lot numbers.

The feature amounts of the waveform data based on the EES data, defect data, QC data, characteristic data, and wafer test data have different units and different numbers of digits. This makes it difficult to directly compare these waveform data based on the EES data, defect data, QC data, characteristic data, and wafer test data. Accordingly, an average μ and standard deviation σ are calculated for each waveform data, and a generalized feature amount x' obtained by standardizing a feature amount x by equation (2) is used as waveform data.

$$x'=((x-\mu)/2\sigma)+1 \qquad (2)$$

This standardization method may also be another method as long as the individual waveforms can be processed on the same order. For example, it is also possible to obtain fluctuation regions of the individual waveforms, and transform these fluctuation regions so that they fall within a specific range.

In step St14 of FIG. 4, the waveform formation unit 2 shown in FIG. 2 checks whether waveform data are generated by transforming all the EES data, defect data, QC data, characteristic data, and wafer test data of all lots into a common waveform. If not all waveform data have been generated yet, the flow returns to step St13. If all waveform data have been generated, the flow advances to step St15.

In step St15, the waveform optimization unit 3 performs waveform optimization. This waveform optimization is performed in accordance with a waveform optimization flowchart shown in FIG. 5.

By the formation of the common waveform in step St13, it is possible to quantitatively analyze the similarity of defect distributions in the plane of the wafer in a fail bit map and pass/fail map. Quantitative analysis of the similarity between lots can be regarded as quantitative analysis of the similarity of waveform data. That is, a lot having waveform data having similar shapes presumably has defective products which distribute into similar clustering defect distributions. This is so because the similarity between waveform data can be quantitatively analyzed. However, not all waveform data of a lot are necessary to check the similarity of waveform data. Therefore, waveform optimization uses only waveform data necessary to check the similarity of defect distributions in the plane of the wafer.

Waveform optimization is done by using a two-level orthogonal table. The two levels of this two-level orthogonal table are used as an adoption level for adopting the type of acquired waveform data, and a non-adoption level for not adopting the type of acquired waveform data.

Figure 5:
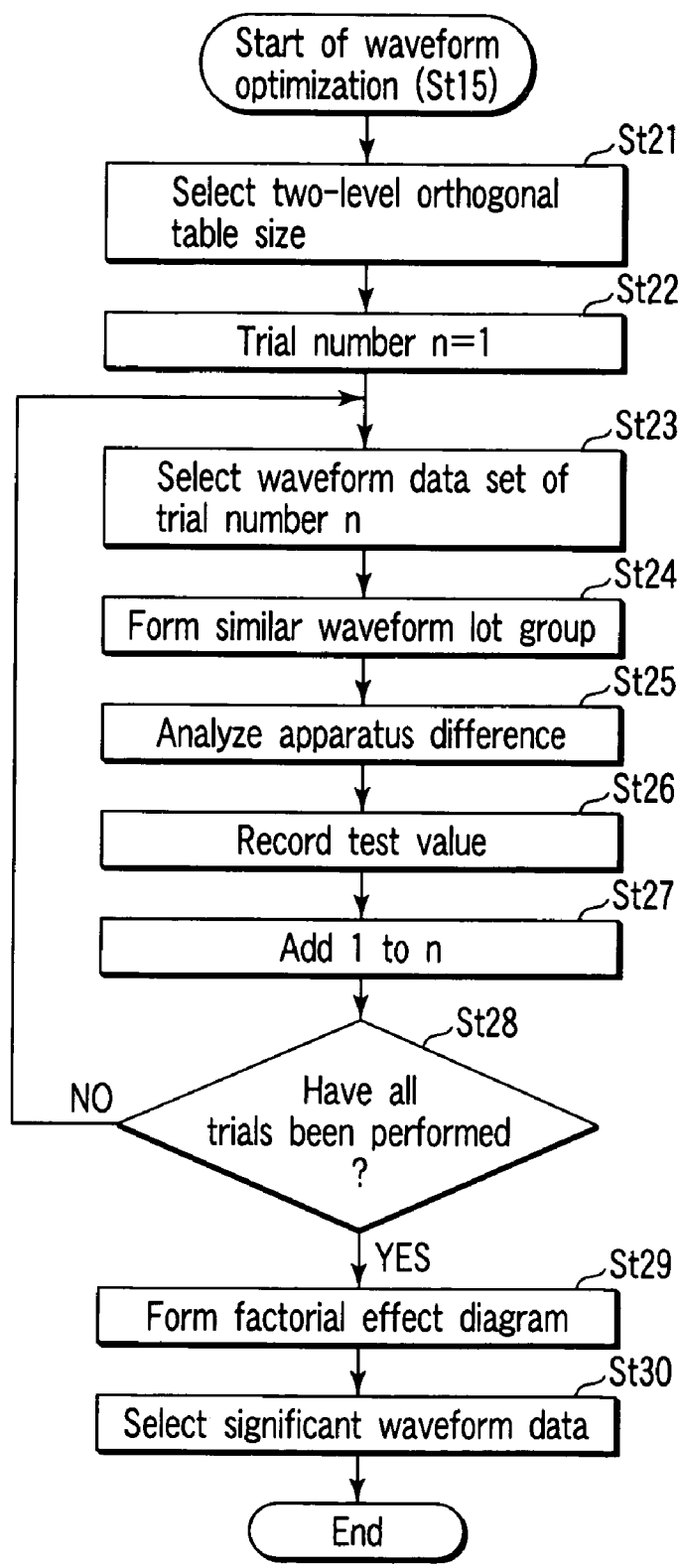
FIG. 5 is a flowchart of waveform optimization as a part of the abnormality cause specifying method according to the embodiment of the present invention.

In step St21 of FIG. 5, on the basis of the orthogonal table database 6 storing orthogonal tables, the orthogonal table size selector 34 shown in FIG. 2 determines the size of a two-level orthogonal table in accordance with the number of types of acquired waveform data. In the first embodiment, for example, an L12 orthogonal table shown in FIG. 13 is used by assuming that 10 types of waveform data are acquired. In this L12 orthogonal table, level 1 is the adoption level, and level 2 is the non-adoption level. It is possible to select whether to adopt the 10 types of waveform data by 12 trials.

Factor numbers 1 to 11 are arranged in the lateral direction of the L12 orthogonal table. As shown in FIG. 14, the allocator 35 allocates waveform data names indicating the types of waveform data to factor numbers 1 to 10. Note that no waveform data is allocated to factor number 11 in the first embodiment.

In step St22, the trial data set generator 33 sets 1 as a trial number. After that, processes in steps St23 to St28 are performed for all trial numbers one by one.

In step St23, the trial data set generator 33 generates a trial data set by selecting waveform data names corresponding to factor numbers on adoption level 1, for each trial experiment in the two-level orthogonal table and for each lot. For example, in a trial experiment of trial number 2, waveform data of factor numbers 1 to 5 indicated by level "1" in the orthogonal table shown in FIG. 13 are adopted, and waveform data of factor numbers 6 to 10 indicated by level "2" are not adopted, thereby generating a trial data set.

In step St24, a trial similarity calculator 36 calculates the trial similarity, which represents the similarity between lots as fabrication units, of the trial data set. As the trial similarity, it is possible to use a correlation coefficient between all target lots concerning feature amounts or generalized feature amounts of waveform data in the trial data set. Although the correlation between wafers can be visually understood from a scatter diagram in which generalized feature amounts of the trial data set are plotted between lots, the trial similarity can be quantitatively analyzed by calculating the correlation coefficient.

The trial set generator 37 generates, for each lot, a trial similar lot set by extracting another lot name for which the similarity, e.g., the correlation coefficient is equal to or larger than a threshold value. In the first embodiment, this threshold value is set to 0.8. If the correlation coefficient is 0.8 or more, it is determined that two lots having this correlation coefficient have similar defect distributions. As shown in FIG. 15, therefore, trial similar lot sets S11 to S13, S21, S22, S31 to S34, ..., S121 to S123 of similar lots are generated for each trial experiment.

As shown in FIG. 15, a plurality of trial similar lot sets sometimes exist for one trial experiment, and numbers are allocated to these lot sets from the one having the largest number of lots as elements of the trial similar lot set. For example, for trial similar lot sets formed by selecting waveform data by the nth trial experiment, a trial similar lot set having the mth largest number of elements is expressed by Snm. For example, in the trial experiment of trial number 2 in the orthogonal table shown in FIG. 13, trial data sets are formed by using the waveform data of factor numbers 1 to 5, and trial similar lot sets are formed by using lots similar to each other in the trial data sets. Assuming that the number of lots having waveforms having five peaks in specific positions of the trial data set is the largest and the number of lots having waveforms having seven peaks is the second largest, a trial similar lot set of lots having waveforms having five peaks is S21, a trial similar lot set of lots having waveforms having seven peaks is S22, and so on.

As shown in FIG. 15, a plurality of trial similar lot sets sometimes exist in each trial experiment, so a similar waveform lot group having trial similar lot sets as constituent elements is formed for each trial experiment. For example, the constituent elements of a similar waveform lot group of trial experiment 1 are trial similar lot sets S11 to S13. In addition, lots fabricated in the clean room 10 for a certain week were set as target lots, and similar lot sets in trial experiments shown in FIG. 15 were obtained for these target lots.

Then, in step St25 of FIG. 5, the waveform optimization unit 3 executes apparatus difference analysis on the obtained trial similar lot set Snm. This apparatus difference analysis is done by statistically testing the bias of the fabrication apparatuses 11 and 13 shown in FIG. 1 which are used in the fabrication of lots forming the trial similar lot set Snm.

More specifically, the step test value calculator 38 calculates the difference between a plurality of fabrication apparatuses used in the fabrication steps and the bias of lots forming the trial similar lot set, for each fabrication step of each trial experiment. This bias presumably represents the degree of the causal relation of the difference between a plurality of fabrication apparatuses used in the fabrication step to lots forming the trial similar lot set. That is, the step test value calculator 38 statistically tests the bias of a fabrication apparatus having fabricated each lot forming the trial similar lot set with respect to a plurality of fabrication apparatuses used in the fabrication step.

Figure 6:
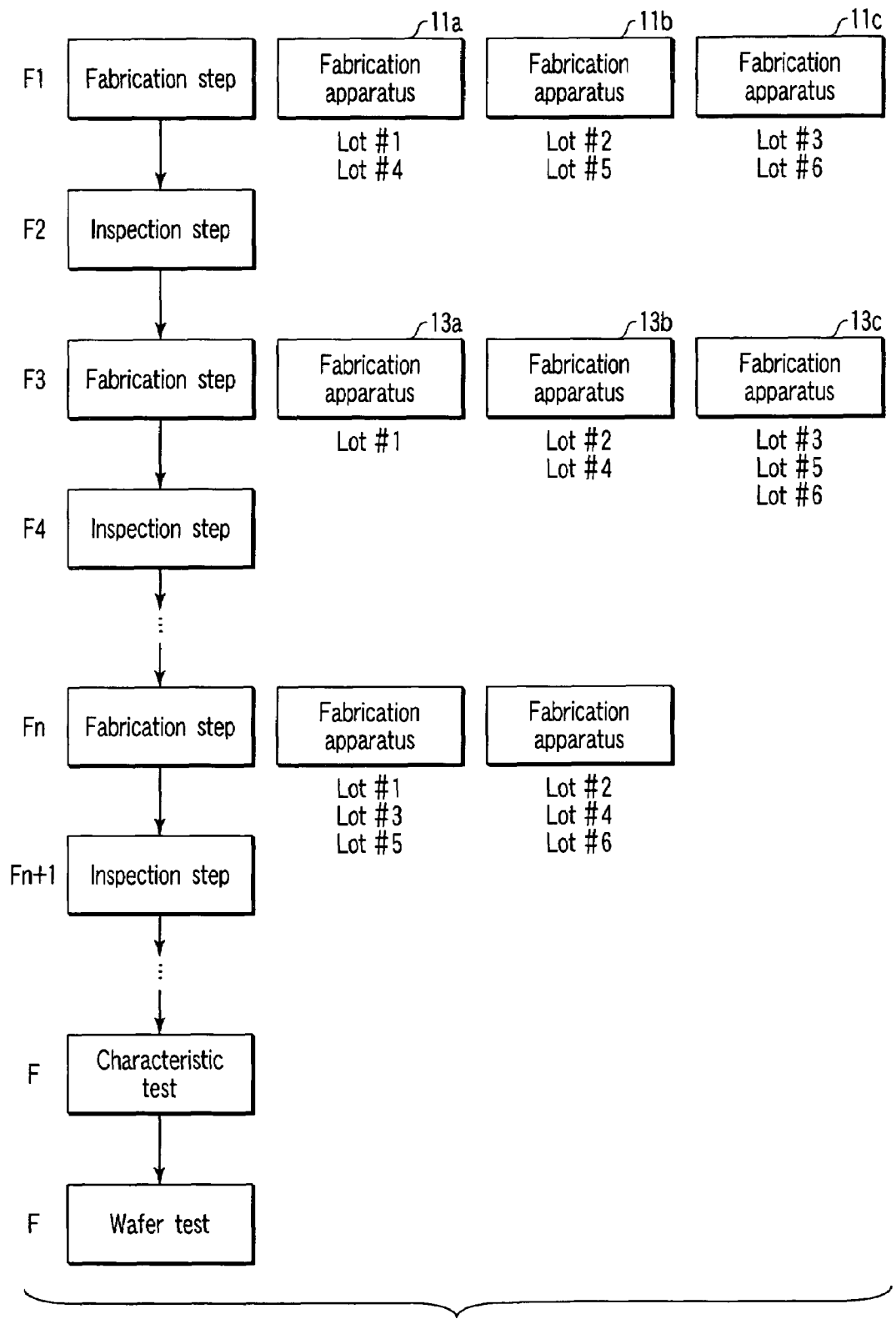
FIG. 6 shows a semiconductor device fabrication flow.

Assume that semiconductor devices are fabricated by a fabrication flow as shown in FIG. 6. This fabrication flow is performed in the order of fabrication step F1, inspection step F2, fabrication step F3, inspection step F4, . . . , fabrication step Fn, inspection step Fn+1, . . . , a characteristic test, and a wafer test.

Assume also that six lots #1 to #6 of semiconductor devices are fabricated by this fabrication flow. In fabrication step F1, three fabrication apparatuses 11*a* to 11*c* are used. In the fabrication apparatus 11*a*, lots #1 and #4 are processed. In the fabrication apparatus 11*b*, lots #2 and #5 are processed. In the fabrication apparatus 11*c*, lots #3 and #6 are processed. In fabrication step F3, three fabrication apparatuses 13*a* to 13*c* are used. In the fabrication apparatus 13*a*, lot #1 is processed. In the fabrication apparatus 13*b*, lots #2 and #4 are processed. In the fabrication apparatus 13*c*, lots #3, #5, and #6 are processed. In fabrication step Fn, two fabrication apparatuses are used. In one fabrication apparatus, lots #1, #3, and #5 are processed. In the other fabrication apparatus, lots #2, #4, and #6 are processed. If constituent elements of the trial similar lot set are lots #1 and #4, the degree of the causal relation of the fabrication apparatus 11*a* having processed the same combination of lots #1 and #4 as above is so set as to be larger than those of the other fabrication apparatuses. As a consequence, it is found that an abnormality has occurred in the fabrication apparatus 11*a*.

The calculation method of the apparatus difference analysis will be explained below. If N fabrication apparatuses are used in fabrication step q, these apparatuses will be represented by fabrication apparatuses $M_1, M_2, \ldots, M_N$. Also, the total processed lot counts of the fabrication apparatuses $M_1, M_2, \ldots, M_N$ are $A_1, A_2, \ldots, A_N$. A total target lot count A is represented by $$A = A_1 + A_2 + \ldots + A_N \quad (3)$$

In addition, the processed defective lot counts of the fabrication apparatuses $M_1, M_2, \ldots, M_N$ are $F_1, F_2, \ldots, F_N$. An element count F of the trial similar lot set Snm is represented by $$F = F_1 + F_2 + \ldots + F_N \quad (4)$$

Expected values $E_1, E_2, \ldots, E_N$ of the processed defective lot counts of the fabrication apparatuses $M_1, M_2, \ldots, M_N$ are represented by $$E_i = F \cdot A_i / A \ (i=1, 2, \ldots, N) \quad (5)$$

Furthermore, the values of $x^2$ of the fabrication apparatuses $M_1, M_2, \ldots, M_N$ are calculated by $$x^2_i = (F_i - E_i)^2 / E_i (i=1, 2, \ldots, N) \quad (6)$$

Then, the value of $x^2_q$ in fabrication step q is calculated by $$x^2_q = x^2_1 + x^2_2 + \ldots + x^2_N \quad (7)$$

Finally, letting $f(x^2,N)$ be the $x^2$ distribution function having a degree of freedom N, an $x^2$ test value Pq of fabrication step q is calculated by $$Pq = f(x^2_q, N-1) \qquad (8)$$

If the $x^2$ test value Pq of fabrication step q is 0.05 or less, it is determined that fabrication step q has a significant difference at a reliability of 95%. That is, the $x^2$ test value Pq of fabrication step q is regarded as the smaller-the-better characteristic. Of the $x^2$ test values Pq of all fabrication steps q in the fabrication flow, an $x^2$ test value Pq having the smallest value is used as an apparatus difference analysis test value Pnm of the trial similar lot set Snm. The apparatus difference analysis test value Pnm presumably represents the abnormality degree which is the degree of occurrence of an abnormality in a fabrication apparatus having fabricated lots forming the trial similar lot set Snm. As shown in FIG. 15, one abnormality degree Pnm is obtained for each trial similar lot set Snm. The smallest abnormality degree Pnm in trial experiment n is used as a minimum abnormality degree Pn of trial experiment n. The values of the minimum abnormality degree Pn are described in the right column of FIG. 15. The minimum abnormality degree Pn is the smallest $x^2$ test value Pq in each trial test.

Note that a minimum value is used when the abnormality degree is the smaller-the-better characteristic like the $x^2$ test value Pq of fabrication step q, but a maximum value is used instead of a minimum value if the abnormality degree is the larger-the-better characteristic. Generally, the abnormality degree Pnm and minimum abnormality degree Pn are so set that the degree of a desired characteristic, i.e., the nominal-the-best characteristic is the largest. Therefore, a general name of the minimum abnormality degree Pn will be a maximum abnormality degree Pn. The optimum test value setting unit 39 sets, for each trial experiment, an abnormality degree whose degree of the nominal-the-best characteristic is the largest of a trial set as the maximum abnormality degree Pn.

In step St26, the optimum test value setting unit 39 stores the value of the maximum abnormality degree Pn in relation to trial number n as shown in FIG. 15.

In step St27, the waveform optimization unit 3 adds 1 to trial number n. In step St28, the waveform optimization unit 3 checks whether all trial experiments have been conducted. If not all the trial experiments have been conducted, the flow returns to step St23. If all the trial experiments have been conducted, the flow advances to step St29.

Figure 16:
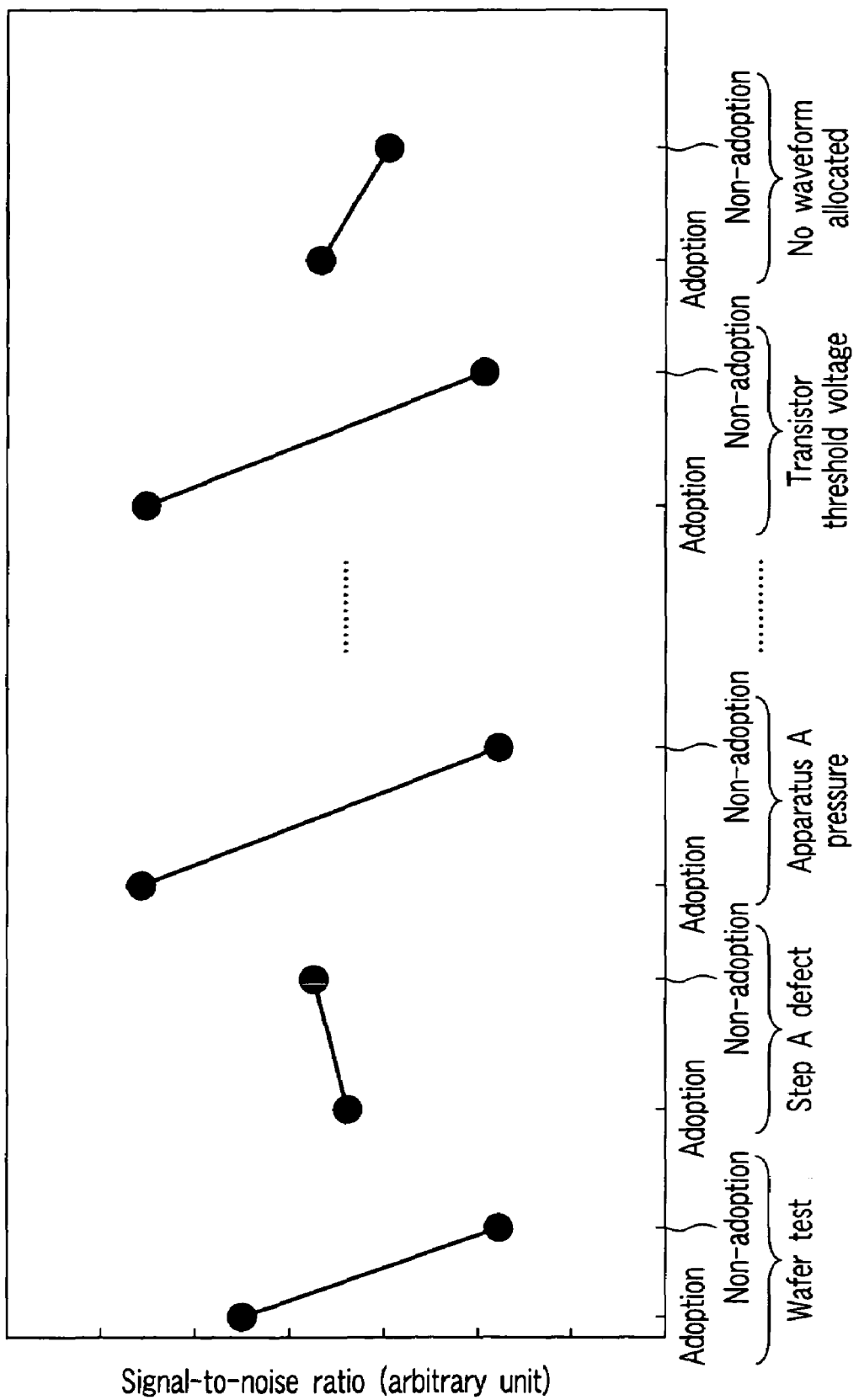
FIG. 16 is a factorial effect diagram using the types of waveform data of generalized feature amounts as factors.

In step St29, as shown in FIG. 16, a factorial effect diagram for optimizing the nominal-the-best characteristic of the maximum abnormality degree Pn by using the adoption level and non-adoption level of each type of waveform data is formed. Recently, the Taguchi Method is beginning to be known as a method of optimizing a system including a plurality of factors. This method can find optimum conditions by a small number of experiments by conducting trial experiments by changing levels, e.g., the conditions of factors in accordance with orthogonal tables. The Taguchi Method was applied to optimization of waveform data set in which level 1 of factors is used as waveform data adoption, and level 2 of factors is used as waveform non-adoption. Since the significance of the test value Pn of the maximum abnormality degree in the first embodiment increases as the value decreases, optimization using the smaller-the-better characteristic was performed using the Taguchi Method. The calculation method of the Taguchi Method will be explained below.

By using maximum abnormality degree test values P1, P2, ..., Pn, ..., P12 for each trial experiment, an S/N (signal-to-noise) ratio $K_i$ of the ith (i=1, 2, ..., 12) trial test is calculated in accordance with the calculation formula of Taguchi Method by $$K_i = -10 \log(P_i^2) \ (i=1, 2, \ldots, 12) \qquad (9)$$

Then, the average value of the levels of factors is calculated. For example, an average value $X_{jk}$ of a level k (k=1, 2) of a factor j to which waveform data j (j=1, 2, ..., 11) is allocated can be calculated by averaging the S/N ratios of trial experiments in which the level of the factor j is k in the orthogonal table. For example, an average $X_{11}$ of level 1 of factor 1 to which waveform data 1 is allocated is calculated by $$X_{11} = (K_1 + K_2 + K_3 + K_4 + K_5 + K_6)/6 \qquad (10)$$

since the level is level 1 in six trial experiments from trials 1 to 6.

Subsequently, as shown in FIG. 16, a graph connecting average values $X_{j1}$ and $X_{j2}$ of levels 1 and 2 of each factor j is formed. This graph shown in FIG. 16 is called a factorial effect diagram, and each of the average values $X_{j1}$ and $X_{j2}$ on the ordinate is called an S/N (signal-to-noise) ratio. Level 1 is the level for adopting the corresponding waveform data j (j=1, 2, ..., 10). Therefore, if the average value $X_{j1}$ of level 1 for adoption is larger than the average value $X_{j2}$ of level 2 for non-adoption, i.e., if the graph decreases to the right, the S/N ratio when the waveform data j is adopted is higher than that when the waveform data j is not adopted. The higher the S/N ratio, the more significant the test value of the apparatus difference analysis. Note that although no waveform data is allocated to factor number 11 in the first embodiment, a difference is produced in S/N ratio between levels 1 and 2 of factor number 11. This difference is probably an error in waveform optimization of the first embodiment. To select waveform data which is effective when used in the apparatus difference analysis, therefore, it is only necessary to select an adoption level allocated to a factor which decreases to the right, i.e., which has a difference in S/N ratio between levels 1 and 2 larger than that in S/N ratio between levels 1 and 2 of factor 11 to which no waveform data is allocated, and for which the S/N ratio of level 1 is higher than that of level 2, and select waveform data corresponding to this adsorption level.

Figures 17, 18:
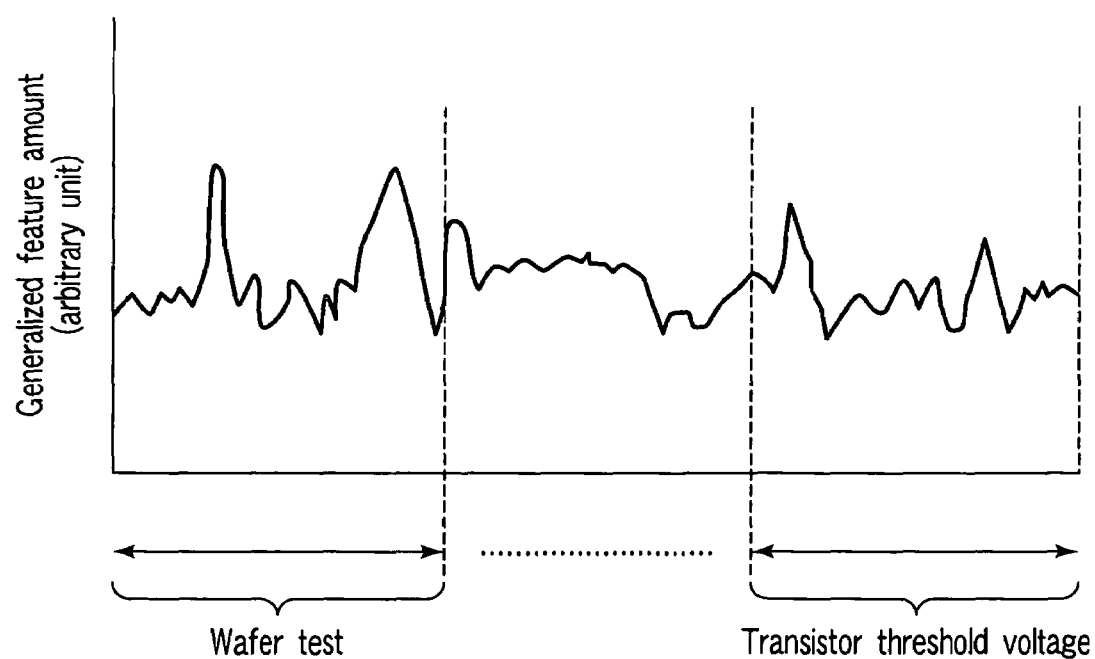
FIG. 17 is a table showing the types of waveform data of optimum generalized feature amounts.
FIG. 18 is a timing chart showing the types of waveform data of optimum generalized feature amounts.

As shown in FIG. 17, in step St30 of FIG. 5, the significant data selector 99 extracts the optimum waveform data name of significant waveform data corresponding to the selected adoption level on the basis of the factorial effect diagram. The wafer test, apparatus A pressure, and transistor threshold voltage were adopted from the factorial effect diagram shown in FIG. 16, and the wafer test, step C defect data, apparatus A pressure, apparatus B gas flow rate, and transistor threshold voltage shown in FIG. 17 were finally adopted. The types of waveform data selected from the factorial effect diagram and adopted were stored in the optimum waveform database 7 shown in FIG. 1.

As shown in FIG. 18, the optimum data set generator 97 generates an optimum data set formed by waveform data corresponding to the optimum waveform data name for each lot. In this manner, the waveform optimization flow shown in FIG. 5 and the waveform optimization in step St15 of FIG. 4 are completed.

In step St16, the apparatus difference analyzing unit 9 forms an optimum similar waveform lot group by using the optimum data set of each lot.

More specifically, the optimum similarity calculator 91 calculates, for the optimum data set, the optimum similarity which represents the degree of similarity between lots. The calculation method of this optimum similarity is the same as the trail similarity calculation method in step St24 of FIG. 5.

Then, like the trial set generator 37, the optimum set generator 92 generates, for each lot, an optimum similar lot set by extracting other lot names having optimum similarities equal to or larger than a threshold value. After that, an optimum similar waveform lot group having these optimum similar lot sets as elements is generated.

In step St17, the optimum test value calculator 93 performed apparatus difference analysis on each optimum similar lot set in the optimum similar waveform lot group. The method of this apparatus difference analysis is the same as the apparatus difference analysis performed for the trial similar lot set in step St25 of FIG. 5. That is, the optimum test value calculator 93 calculates, for each fabrication step, the difference between a plurality of fabrication apparatuses used in the fabrication step, and the optimum test value which represents the degree of the causal relation of lots forming the optimum similar lot set. More specifically, the optimum test value calculator 93 statistically tests the bias of a fabrication apparatus having fabricated each lot forming the optimum similar lot set with respect to a plurality of fabrication apparatuses used in the fabrication step.

Figure 19:
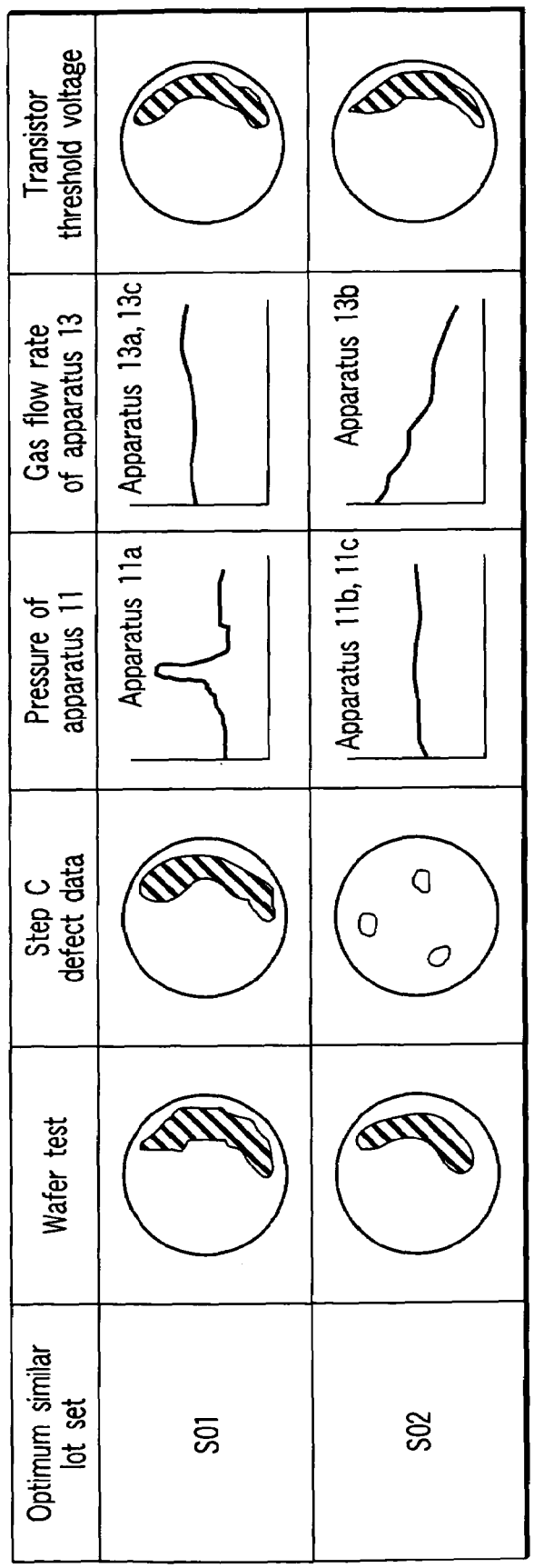
FIG. 19 is a table showing a list of optimum similar lot sets.

In step St18, for each optimum similar lot set, the determination unit 94 determines, on the basis of the optimum test value, whether the causal relation of the optimum similar lot set to the difference between fabrication apparatuses is significant. More specifically, the determination unit 94 determines that the causal relation of the optimum similar lot set to a fabrication apparatus having an optimum test value meeting a predetermined threshold value is significant, and that the causal relation of the optimum similar lot set to a fabrication apparatus having an optimum test value not satisfying the threshold value is not significant. As shown in FIG. 19, significant optimum similar lot sets S01 and S02 were obtained by this determination. For each optimum similar lot set, the extractor 95 extracts, as an abnormality cause, a fabrication apparatus for which the causal relation is found to be significant.

In step St19, the output unit 96 outputs an abnormality cause. Also, as shown in FIG. 19, the waveform data of each lot in the optimum similar lot sets S01 and S02 were averaged. In addition, the wafer test data, the QC data of the step C defect data, and the transistor threshold voltage are shown as the in-plane tendencies of the wafers forming the lot. The average of the time series fluctuations of the apparatus state is also shown for each of the chamber pressure of the fabrication apparatus 11 and the EES data of the gas flow rate of the fabrication apparatus 13. As shown in FIG. 19, the wafer test data indicates that the number of defects was large on the outer periphery on the right side of the wafer in both the optimum similar lot sets S01 and S02. In the optimum similar lot set S01, however, many abnormalities were found on the right side of the wafer in fabrication step C, and the transistor threshold voltage distribution was also abnormal on the right side of the wafer. The EES data of the step C defect data which was simultaneously extracted reveals that the abnormality cause of the optimum similar lot set S01 was the pressure abnormality of the fabrication apparatus 11a.

On the other hand, the gas flow rate fluctuation of the fabrication apparatus 13b was the abnormality cause of the optimum similar lot set S02. In the conventional method, similar lots were formed by using, e.g., wafer test data alone, and apparatus difference analysis was performed on the formed similar lots. However, apparatus difference analysis performed on optimum similar lot sets, such as the optimum similar lot sets S01 and S02 in which defects are caused on the same right-side outer periphery of the wafer but the abnormality causes are different as in the first embodiment, cannot separately specify these abnormality causes. In the first embodiment, it is possible to accurately form similar lot sets and specify defect causes by generally processing a plurality of types of waveform data pertaining to lots. In this way, the abnormality cause specifying method is completed. This abnormality cause specifying method can be expressed by an abnormality cause specifying program which can be executed as a procedure by a computer. The abnormality cause specifying method can be performed by allowing a computer to execute this abnormality cause specifying program.

In the first embodiment as described above, various types of data related to lots are transformed into waveform data having a common format, the waveform data are compared to each other to form a similar lot set including lots corresponding to similar waveform data, and apparatus difference analysis is performed between a plurality of lots forming the similar lot set. A two-level orthogonal table is used to determine whether to adopt each type of waveform data, and some waveform data are not adopted in the apparatus difference analysis and the like by optimizing the smaller-the-better or the larger-the-better characteristic of the test value of the apparatus difference analysis. This makes it possible to reduce the calculation amount, and accurately and efficiently specify an abnormality cause.

Second Embodiment

In the first embodiment, whether to adopt waveform data is selected for all types of waveform data by using a two-level orthogonal table. However, it is also possible to perform selection beforehand so that specific waveform data is always selected as in the second embodiment. For example, assume that there is a clustering defect by which a number of defective chips are produced in the wafer center in a wafer test, and there are a plurality of causes for the same clustering defect in the wafer center.

In the first embodiment, a wafer center defective lot group Sc is formed using only waveform data of the wafer test. However, the cause of the defect cannot be specified even when apparatus difference analysis is performed on the wafer center defective lot group Sc.

In the second embodiment, therefore, wafer test data is always adopted in any trial when waveform data is to be selected by using an orthogonal table. In addition, when an optimum similar lot group Sco is to be formed from the adopted waveform data, lots are collected from the wafer center defective lot group Sc. In apparatus difference analysis, all wafers as objects and the optimum similar lot group Sco are tested. As a consequence, waveform data which identifies a wafer center defect lot group Sc which cannot be identified by the wafer test data is extracted. Each individual abnormality cause can be specified by performing apparatus difference analysis on the identified wafer center defective lot group Sc.

Third Embodiment

Figure 20A:
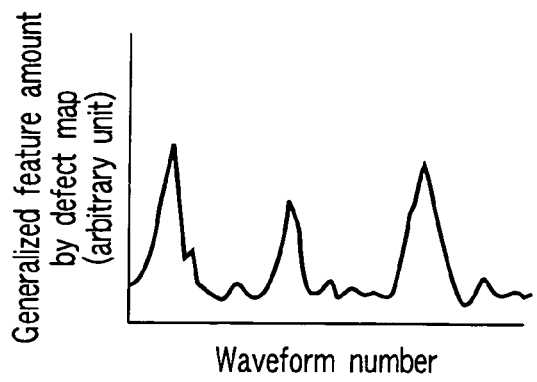
FIGS. 20A and 20B are timing charts showing a defect map and chamber pressure, respectively, as waveform data of generalized feature amounts of optimum similar lot sets of the embodiment of the present invention.
Figure 20B:
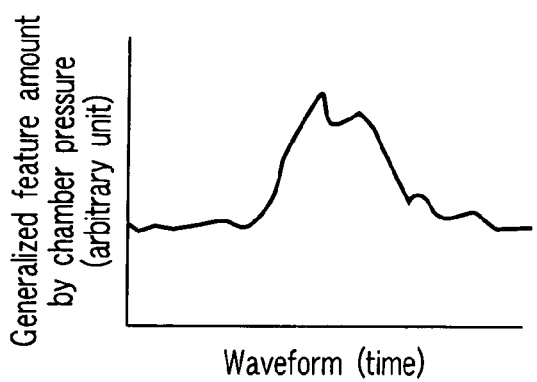
Figure 21:
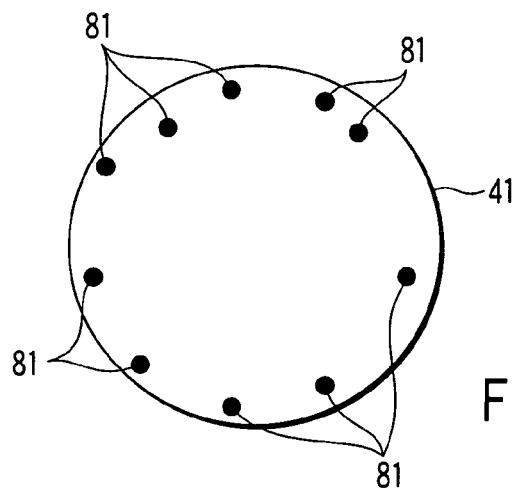
FIG. 21 is a fail bit map of a wafer in a lot forming an optimum similar lot set.

In the third embodiment, a method which immediately detects an abnormality in a fabrication step and controls the detected fabrication step by using only a waveform data group acquired in semiconductor device fabrication steps will be described. Data acquired in semiconductor device fabrication steps is called inline data, and examples of the inline data are defect data, EES data, and QC data. The semiconductor device fabrication method of the first embodiment was exclusively applied to the inline data. Consequently, in an optimum similar lot set using an optimum waveform data set obtained by connecting waveform data of defect map data of fabrication step C shown in FIG. 20A and waveform data of chamber pressure data of a fabrication apparatus in fabrication step C shown in FIG. 20B, a large abnormality degree was detected in a specific fabrication apparatus in fabrication step C. When defect map data in fabrication step C of wafers in lots forming the optimum similar lot set was checked, it was found that a number of dust particles 81 were produced on the periphery of a wafer as shown in FIG. 21. The dust particles 81 were found to be produced by an abnormal fluctuation in chamber pressure of the specific fabrication apparatus in fabrication step C. Therefore, a control program of this specific fabrication apparatus in fabrication step C was so changed as not to produce this pressure fluctuation. As a consequence, no wafer peripheral dust was produced any longer in fabrication step C.

As described above, the occurrence of defects in semiconductor devices can be minimized by immediately finding an abnormality cause by exclusively using inline data, and adjusting and controlling a process performed by a fabrication apparatus as the abnormality cause.

Fourth Embodiment

Figure 22A:
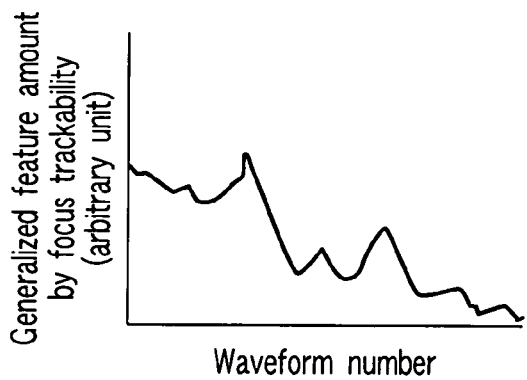
FIGS. 22A and 22B are timing charts showing focus trackability and synchronization accuracy, respectively, as waveform data of generalized feature amounts of optimum similar lot sets of the embodiment of the present invention.
Figure 22B:
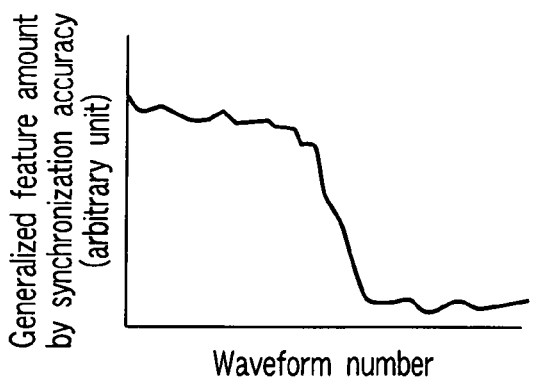

In the fourth embodiment, a case in which the abnormality cause specifying method of the first embodiment is exclusively performed in a specific fabrication step of a semiconductor device fabrication method will be explained. A total of 250 types of EES data were acquired from a developer application unit, baking unit, stepper unit, and developing unit of a lithography apparatus in fabrication step D. The semiconductor device fabrication method of the first embodiment was exclusively applied to the EES data of this lithography apparatus. Consequently, an optimum similar lot set including lots having specific waveforms as waveform data of focus trackability data shown in FIG. 22A and waveform data of synchronization accuracy data shown in FIG. 22B was generated. When a resist dimension significant difference test was conducted on the lots forming the optimum similar lot set and other lots, a resist dimension was significantly small in the lots of the optimum similar lot set. The value of this resist dimension was close to the lower limit of an allowable value of the dimension fluctuation. Therefore, a controller of the lithography apparatus was adjusted and improved so as to prevent the waveform data of the focus trackability data and the waveform data of the synchronization accuracy data from fluctuating into any specific waveform. As a result of this improvement, the dimensional fluctuation in resist dimension caused by focus trackability and synchronization accuracy did not occur any longer.

As described above, even in an individual fabrication apparatus such as a lithography apparatus, the occurrence of defects in semiconductor devices can be minimized by immediately finding an abnormality cause by exclusively using inline data concerning the lithography apparatus, and adjusting and controlling a process pertaining to the abnormality cause in the lithography apparatus.

Each embodiment of the present invention can provide an abnormality cause specifying method and abnormality cause specifying system capable of specifying an abnormal fabrication step as the cause of a defective product even in products fabricated through an enormous number of fabrication steps.

The first to fourth embodiments merely indicate practical examples of the present invention when it is practiced, so the technical scope of the present invention should not be limitedly interpreted by the first to fourth embodiments. For example, processing is performed lot by lot in the first to fourth embodiments, but it is also possible to use data obtained from each wafer or each chip. The present invention can be practiced in various forms without departing from its technical concept or its principal characteristic features. That is, the present invention can be changed, improved, and partially used without departing from the scope of claims, so the scope of claims of the present invention includes all these changes, improvements, and partial uses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An abnormality cause specifying method comprising:

acquiring, for each fabrication lot, a plurality of types of inspection data in a plurality of fabrication steps of a product fabrication process;

generating a feature amount by standardizing the inspection data for each type;

generating, for each fabrication lot, a trial data set by selecting the feature amount corresponding to the inspection data of a type on an adoption level for each trial experiment in a two-level orthogonal table, by using two levels of the two-level orthogonal table as the adoption level and a non-adoption level of a type of inspection data, and using a factor of the two-level orthogonal table as a type of inspection data;

calculating, for the trial data set, a trial similarity representing a degree of similarity between the fabrication lots;

generating, for each fabrication lot, a trial set by extracting another fabrication lot whose trial similarity is not less than a threshold value;

calculating, for each trial experiment and for each fabrication step, a step test value representing a degree of a causal relation of the fabrication lot forming the trial set to a plurality of fabrication apparatuses provided in a fabrication step, wherein the step test value is a value indicating which fabrication apparatus of the plurality of fabrication apparatuses is used for the fabrication lot forming the trial set;

setting, for each trial experiment, a step test value whose degree of a nominal-the-best characteristic is the largest of the trial set as a trial experiment test value;

generating, for each fabrication lot, an optimum data set including the feature amount corresponding to the type of inspection data for which the adoption level is selected, on the basis of a factorial effect diagram for optimizing the nominal-the-best characteristic of the trial experiment test value by using the adoption level and the non-adoption level of each type;

calculating, for the optimum data set, an optimum similarity representing a degree of similarity between the fabrication lots;

generating, for each fabrication lot, an optimum set by extracting another fabrication lot whose optimum similarity is not less than a threshold value;

calculating, for each fabrication step, an optimum test value representing a degree of a causal relation of the fabrication lot forming the optimum set to a plurality of fabrication apparatuses provided in the fabrication step, the optimum test value being a value indicating which fabrication apparatus of the plurality of fabrication apparatuses is used for the fabrication lot forming the optimum set;

determining, for each optimum set, whether the causal relation of the optimum set to the fabrication apparatuses is significant, on the basis of the optimum test value; and extracting, by an extractor, for each optimum set, the fabrication apparatus as an object of the causal relation found to be significant, as an abnormality cause.

2. The method according to claim 1, wherein the inspection data includes at least one of equipment engineering system (EES) data, defect data, quality control (QC) data, characteristic data, and wafer test data, and the EES data is a physical amount representing an operating condition of a fabrication apparatus used to fabricate a product, the defect data indicates a result of product abnormality inspection performed before and after a fabrication step, the QC data is one of a film thickness of a thin film added by processing in the fabrication step and a dimension of a shape processed in the fabrication step, the characteristic data is an electrical characteristic obtained by measuring a test element group for electrical characteristic evaluation formed together with the product in the fabrication step, and the wafer test data is obtained by an electrical characteristic test conducted on the product after a wafer process is completed.

3. The method according to claim 1, wherein the feature amount is obtained by calculating an average $\mu$ and a standard deviation $\sigma$ for the inspection data, and standardizing inspection data x into a generalized feature amount x' by equation $x'=((x-\mu)/2\sigma)+1$.

4. The method according to claim 1, wherein a correlation coefficient between all fabrication lots as objects concerning the feature amount of the trial data set is used as the trial similarity.

5. The method according to claim 1, wherein in the calculation of the step test value, a bias of said plurality of fabrication apparatuses used in a fabrication step of each of the fabrication lots forming the trial set is statistically tested, and in the calculation of the optimum test value, a bias of said plurality of fabrication apparatuses used in a fabrication step of each of the fabrication lots forming the optimum set is statistically tested.

6. The method according to claim 1, wherein the determining includes determining a causal relation of the optimum set to a fabrication apparatus whose optimum test value satisfies a predetermined threshold value is significant, and determining a causal relation of the optimum set to a fabrication apparatus whose optimum test value does not satisfy the predetermined threshold value is not significant.

7. An abnormality cause specifying system comprising:

a data acquisition unit which acquires, for each fabrication lot, a plurality of types of inspection data in a plurality of fabrication steps of a product fabrication process;

a feature amount generator which generates a feature amount by standardizing the inspection data for each type;

a trial data set generator which generates, for each fabrication lot, a trial data set by selecting the feature amount corresponding to the inspection data of a type on an adoption level for each trial experiment in a two-level orthogonal table, by using two levels of the two-level orthogonal table as the adoption level and a non-adoption level of a type of inspection data, and using a factor of the two-level orthogonal table as a type of inspection data;

a trial similarity calculator which calculates, for the trial data set, a trial similarity representing a degree of similarity between the fabrication lots;

a trial set generator which generates, for each fabrication lot, a trial set by extracting another fabrication lot whose trial similarity is not less than a threshold value;

a step test value calculator which calculates, for each trial experiment and for each fabrication step, a step test value representing a degree of a causal relation of the fabrication lot forming the trial set to a plurality of fabrication apparatuses provided in a fabrication step, the step test value being a value indicating which fabrication apparatus of the plurality of fabrication apparatuses is used for the fabrication lot forming the test set;

a maximum test value setting unit which sets, for each trial experiment, a step test value whose degree of a nominal-the-best characteristic is the largest of the trial set as a maximum test value;

an optimum data set generator which generates, for each fabrication lot, an optimum data set including the feature amount corresponding to the type of inspection data for which the adoption level is selected, on the basis of a factorial effect diagram for optimizing the nominal-the-best characteristic of the maximum test value by using the adoption level and the non-adoption level of each type;

an optimum similarity calculator which calculates, for the optimum data set, an optimum similarity representing a degree of similarity between the fabrication lots;

an optimum set generator which generates, for each fabrication lot, an optimum set by extracting another fabrication lot whose optimum similarity is not less than a threshold value;

an optimum test value calculator which calculates, for each fabrication step, an optimum test value representing a degree of a causal relation of the fabrication lot forming the optimum set to a plurality of fabrication apparatuses provided in the fabrication step, the optimum test value being a value indicating which fabrication apparatus of the plurality of fabrication apparatuses is used for the fabrication lot forming the optimum set;

a determination unit which determines, for each optimum set, whether the causal relation of the optimum set to the fabrication apparatuses is significant, on the basis of the optimum test value; and an extractor which extracts, for each optimum set, the fabrication apparatus as an object of the causal relation found to be significant, as an abnormality cause.

8. A system according to claim 7, wherein the inspection data includes at least one of equipment engineering system (EES) data, defect data, quality control (QC) data, characteristic data, and wafer test data, and the EES data is a physical amount representing an operating condition of a fabrication apparatus used to fabricate a product, the defect data indicates a result of product abnormality inspection performed before and after the fabrication step, the QC data is one of a film thickness of a thin film added by processing in the fabrication step and a dimension of a shape processed in the fabrication step, the characteristic data is an electrical characteristic obtained by measuring a test element group for electrical characteristic evaluation formed together with the product in the fabrication step, and the wafer test data is obtained by an electrical characteristic test conducted on the product after a wafer process is completed.

9. A system according to claim 7, wherein the feature amount is obtained by calculating an average $\mu$ and a standard deviation $\sigma$ for the inspection data, and standardizing inspection data x into a generalized feature amount x' by equation $x'=((x-\mu)/2\sigma)+1$.

10. A system according to claim 7, wherein a correlation coefficient between all fabrication lots as objects concerning the feature amount of the trial data set is used as the trial similarity.

11. A system according to claim 7, wherein
in the calculation of the step test value, a bias of said plurality of fabrication apparatuses used in a fabrication step of each of the fabrication lots forming the trial set is statistically tested, and
in the calculation of the optimum test value, a bias of said plurality of fabrication apparatuses used in a fabrication step of each of the fabrication lots forming the optimum set is statistically tested.

12. A system according to claim 7, wherein the determining includes determining a causal relation of the optimum set to a fabrication apparatus whose optimum test value satisfies a predetermined threshold value is significant, and determining a causal relation of the optimum set to a fabrication apparatus whose optimum test value does not satisfy the predetermined threshold value is not significant.

13. A semiconductor device fabrication method comprising:
fabricating a semiconductor device as a product;
performing an abnormality cause specifying method for the semiconductor device, the abnormality cause specifying method comprising
acquiring, for each fabrication lot, a plurality of types of inspection data in a plurality of fabrication steps of a product fabrication process,
generating a feature amount by standardizing the inspection data for each type, generating, for each fabrication lot, a trial data set by selecting the feature amount corresponding to the inspection data of a type on an adoption level for each trial experiment in a two-level orthogonal table, by using two levels of the two-level orthogonal table as the adoption level and a non-adoption level of a type of inspection data, and using a factor of the two-level orthogonal table as a type of inspection data,
calculating, for the trial data set, a trial similarity representing a degree of similarity between the fabrication lots,
generating, for each fabrication lot, a trial set by extracting another fabrication lot whose trial similarity is not less than a threshold value,
calculating, for each trial experiment and for each fabrication step, a step test value representing a degree of a causal relation of the fabrication lot forming the trial set to a plurality of fabrication apparatuses provided in a fabrication step, the step test value being a value indicating which fabrication apparatus of the plurality of fabrication apparatuses is used for the fabrication lot forming the test set,
setting, for each trial experiment, a step test value whose degree of a nominal-the-best characteristic is the largest of the trial set as a trial experiment test value,
generating, for each fabrication lot, an optimum data set including the feature amount corresponding to the type of inspection data for which the adoption level is selected, on the basis of a factorial effect diagram for optimizing the nominal-the-best characteristic of the trial experiment test value by using the adoption level and the non-adoption level of each type,
calculating, for the optimum data set, an optimum similarity representing a degree of similarity between the fabrication lots,
generating, for each fabrication lot, an optimum set by extracting another fabrication lot whose optimum similarity is not less than a threshold value,
calculating, for each fabrication step, an optimum test value representing a degree of a causal relation of the fabrication lot forming the optimum set to a plurality of fabrication apparatuses provided in the fabrication step, the optimum test value being a value indicating which fabrication apparatus of the plurality of fabrication apparatuses is used for the fabrication lot forming the optimum set,
determining, for each optimum set, whether the causal relation of the optimum set to the fabrication apparatuses is significant, on the basis of the optimum test value, and extracting, for each optimum set, the fabrication apparatus as an object of the causal relation found to be significant, as an abnormality cause;
extracting, by an extractor, for each optimum set, the inspection data related to a fabrication step in which the fabrication apparatus as the abnormality cause is used, as abnormality data; and
adjusting the fabrication apparatus extracted as the abnormality cause such that the abnormality data is corrected.

14. The method according to claim 13, wherein
the inspection data includes at least one of equipment engineering system (EES) data, defect data, quality control (QC) data, characteristic data, and wafer test data, and
the EES data is a physical amount representing an operating condition of a fabrication apparatus used to fabricate a product, the defect data indicates a result of product abnormality inspection performed before and after the fabrication step, the QC data is one of a film thickness of a thin film added by processing in the fabrication step and a dimension of a shape processed in the fabrication step, the characteristic data is an electrical characteristic obtained by measuring a test element group for electrical characteristic evaluation formed together with the product in the fabrication step, and the wafer test data is obtained by an electrical characteristic test conducted on the product after a wafer process is completed.

15. The method according to claim 13, wherein the feature amount is obtained by calculating an average $\mu$ and a standard deviation $\sigma$ for the inspection data, and standardizing inspection data x into a generalized feature amount x' by equation $x'=((x-\mu)/2\sigma)+1$.

16. The method according to claim 13, wherein a correlation coefficient between all fabrication lots as objects concerning the feature amount of the trial data set is used as the trial similarity.

17. The method according to claim 13, wherein
in the calculation of the step test value, a bias of said plurality of fabrication apparatuses used in a fabrication step of each of the fabrication lots forming the trial set is statistically tested, and
in the calculation of the optimum test value, a bias of said plurality of fabrication apparatuses used in a fabrication step of each of the fabrication lots forming the optimum set is statistically tested.

18. The method according to claim 13, wherein the determining includes determining a causal relation of the optimum set to a fabrication apparatus whose optimum test value satisfies a predetermined threshold value is significant, and determining a causal relation of the optimum set to a fabrication apparatus whose optimum test value does not satisfy the predetermined threshold value is not significant.

* * * * *